(12) United States Patent  
Iwamatsu et al.

(10) Patent No.: US 8,269,288 B2  
(45) Date of Patent: Sep. 18, 2012

(54) SEMICONDUCTOR DEVICE AND METHOD FOR MANUFACTURING THE SAME

(75) Inventors: Toshiaki Iwamatsu, Tokyo (JP); Takashi Terada, Tokyo (JP); Hirofumi Shinohara, Tokyo (JP); Kozo Ishikawa, Hyogo (JP); Ryuta Tsuchiya, Tokyo (JP); Kiyoshi Hayashi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 169 days.

(21) Appl. No.: 12/253,563

(22) Filed: Oct. 17, 2008

(65) Prior Publication Data

US 2009/0101977 A1    Apr. 23, 2009

(30) Foreign Application Priority Data

Oct. 22, 2007   (JP) ................................. 2007-273679

(51) Int. Cl.  
*H01L 29/06* (2006.01)  
(52) U.S. Cl. .................. 257/401; 257/E29.13  
(58) Field of Classification Search .................. 257/401, 257/E29.13, E29.134  
See application file for complete search history.

(56) References Cited

U.S. PATENT DOCUMENTS

| 7,314,787 | B2 | 1/2008 | Yagishita | |
| 7,919,364 | B2* | 4/2011 | Sonsky et al. | 438/135 |
| 2006/0189058 | A1* | 8/2006 | Lee et al. | 438/198 |
| 2006/0194378 | A1* | 8/2006 | Yagishita | 438/183 |
| 2006/0220134 | A1* | 10/2006 | Huo et al. | 257/351 |
| 2006/0275988 | A1* | 12/2006 | Yagishita et al. | 438/275 |
| 2007/0045736 | A1 | 3/2007 | Yagishita | |

FOREIGN PATENT DOCUMENTS

| JP | 2005-294789 | 10/2005 |
| JP | 2007-035957 | 2/2007 |

* cited by examiner

*Primary Examiner* — Minh-Loan T Tran  
*Assistant Examiner* — Wensing Kuo  
(74) *Attorney, Agent, or Firm* — McDermott Will & Emery LLP

(57) ABSTRACT

An object of the present invention is to provide a semiconductor device having a fin-type transistor that is excellent in characteristics by forming a fin-shaped semiconductor portion and a gate electrode with high precision or by making improvement regarding variations in characteristics among elements. The present invention is a semiconductor device including a fin-shaped semiconductor portion having a source region formed on one side thereof and a drain region formed on the other side thereof, and a gate electrode formed between the source region and the drain region to surround the fin-shaped semiconductor portion with a gate insulating film interposed therebetween. One solution for solving the problem according to the invention is that the gate electrode uses a metal material or a silicide material that is wet etchable.

3 Claims, 22 Drawing Sheets

F I G . 3
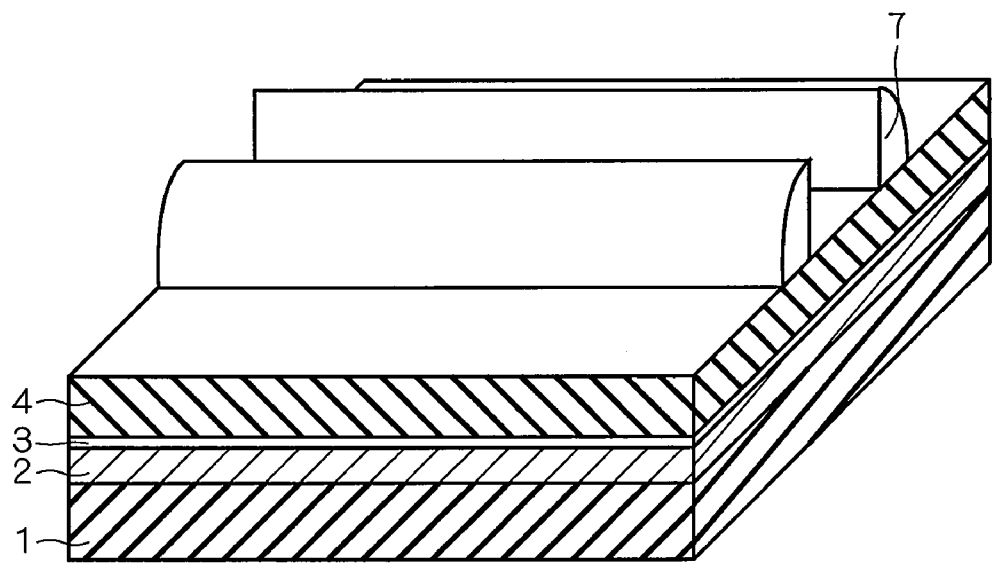
F I G . 4
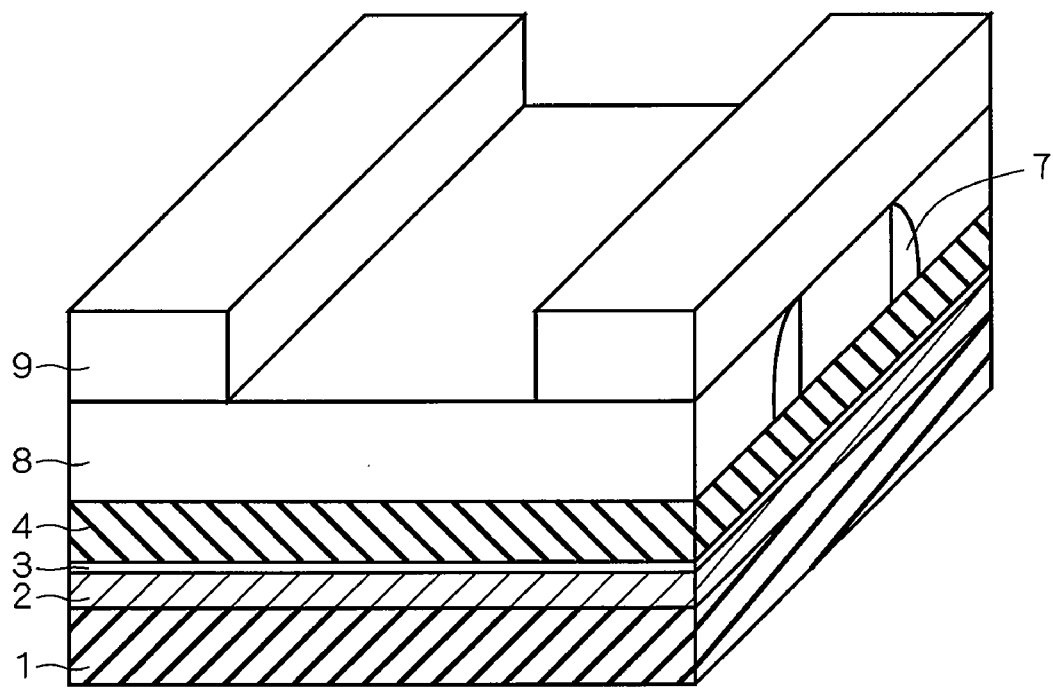

F I G . 1 2
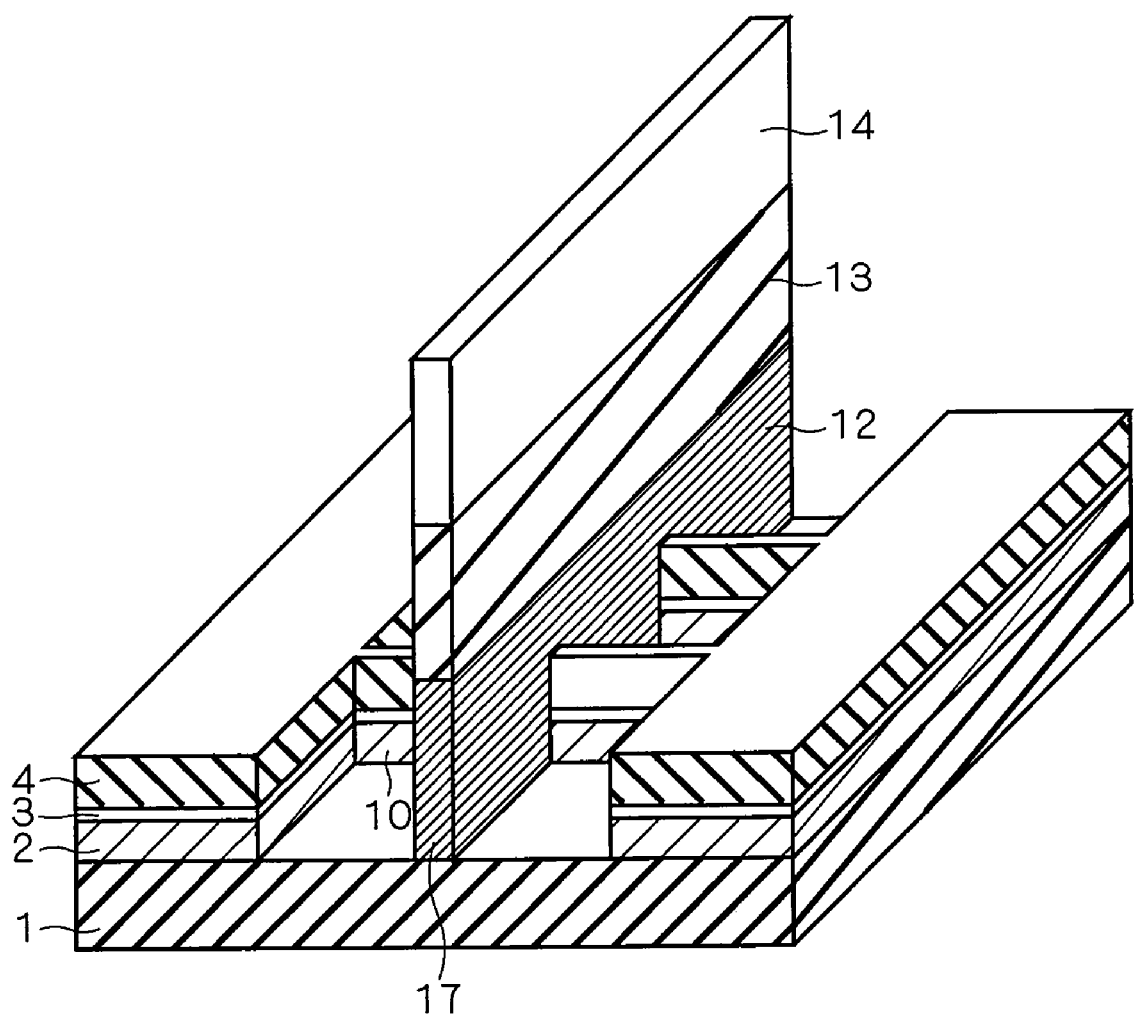

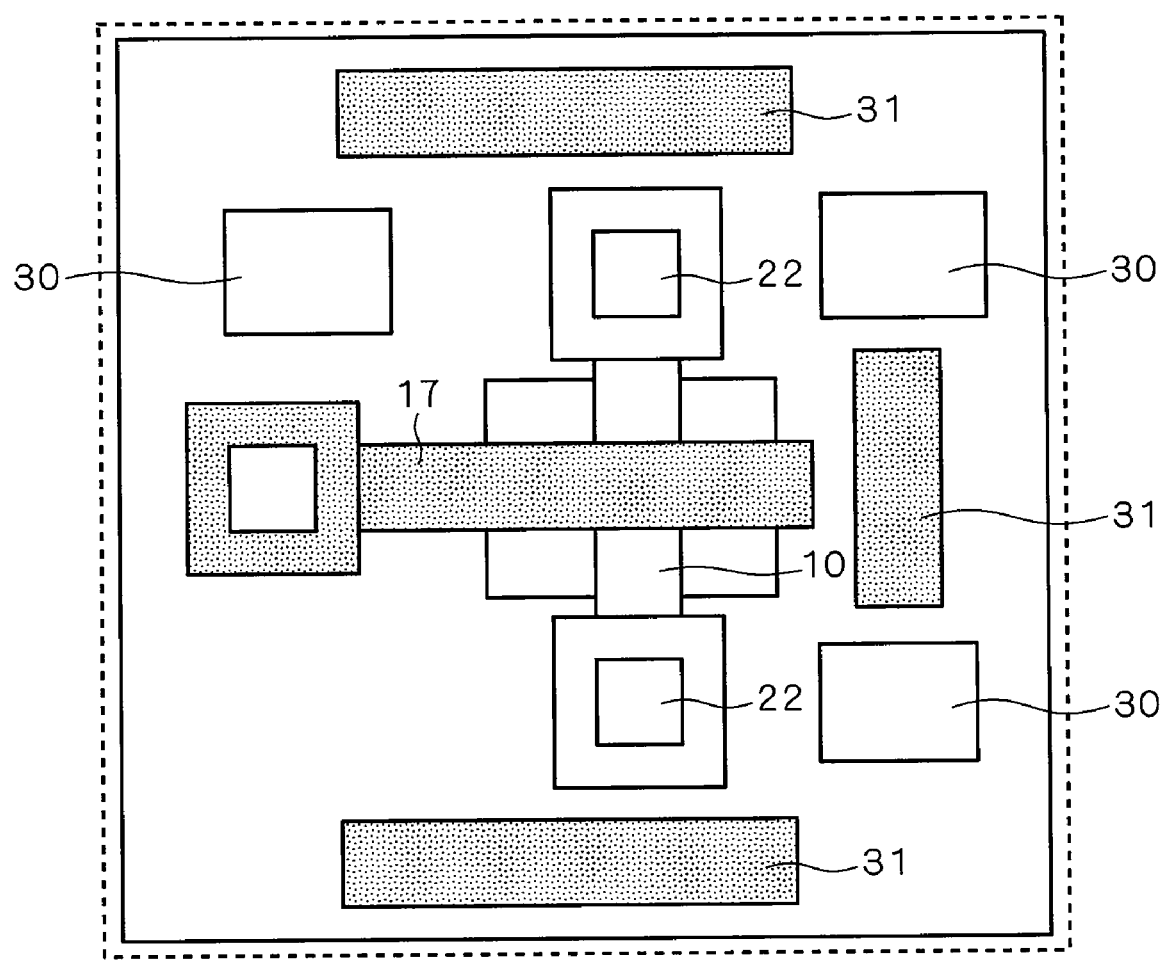
F I G . 1 8

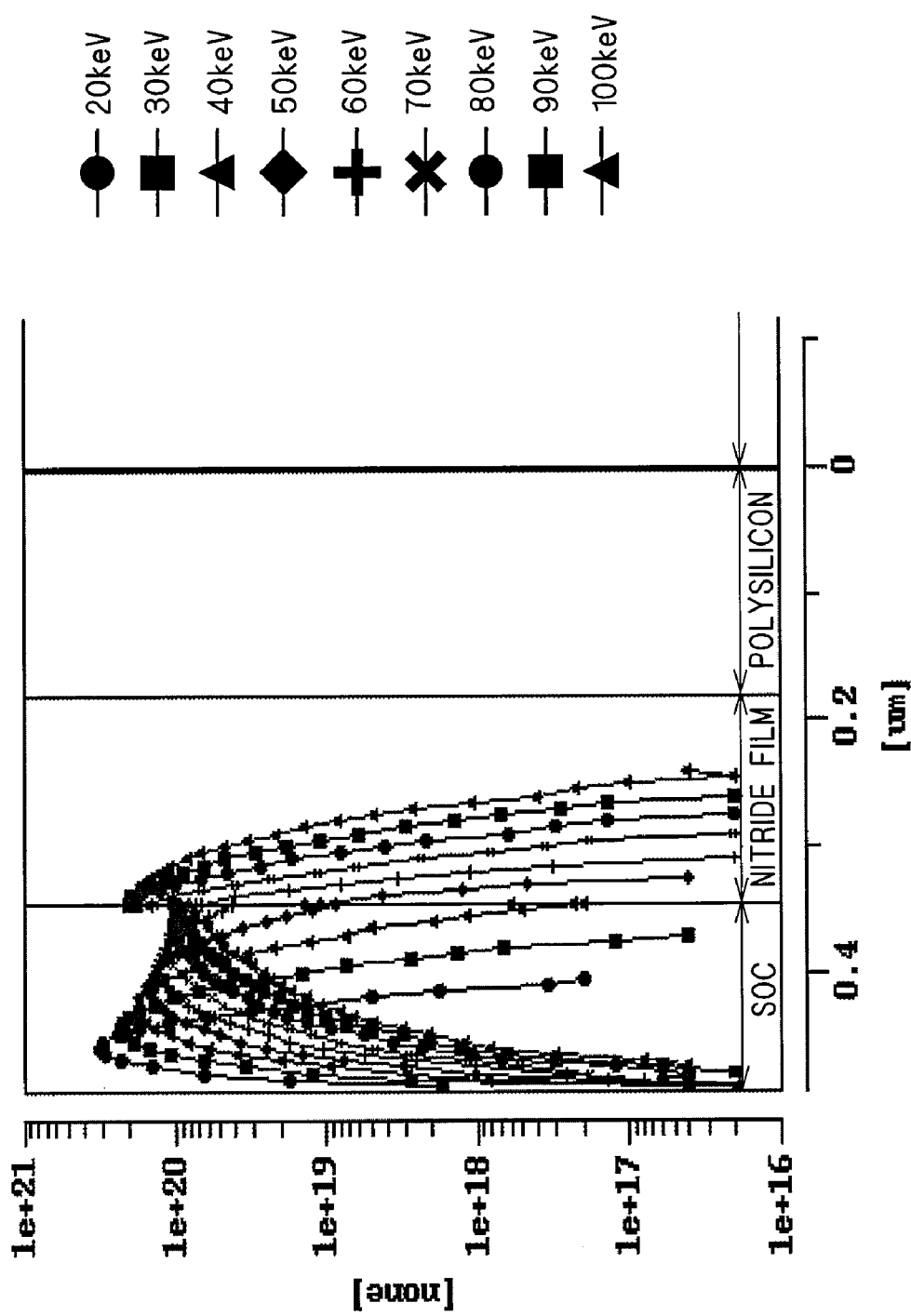

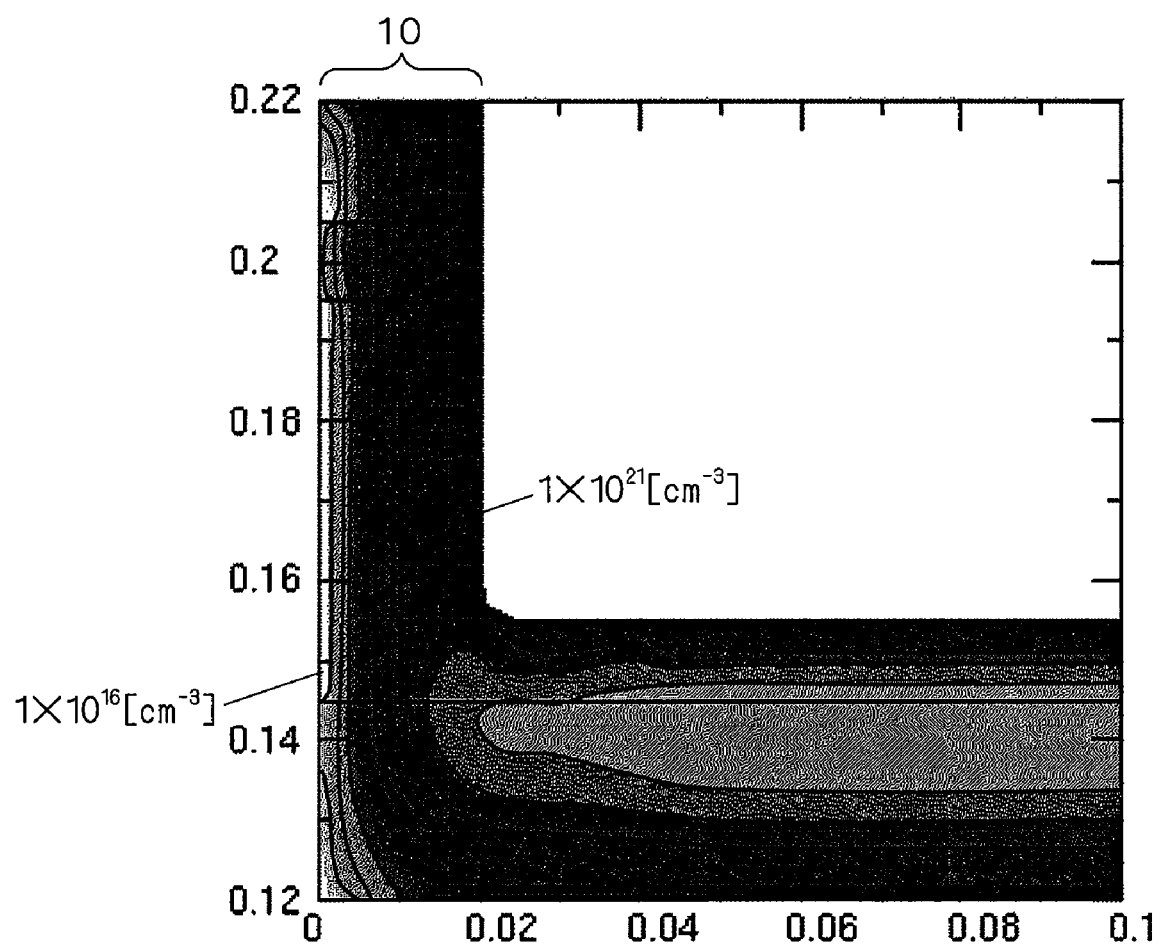
F I G . 2 2

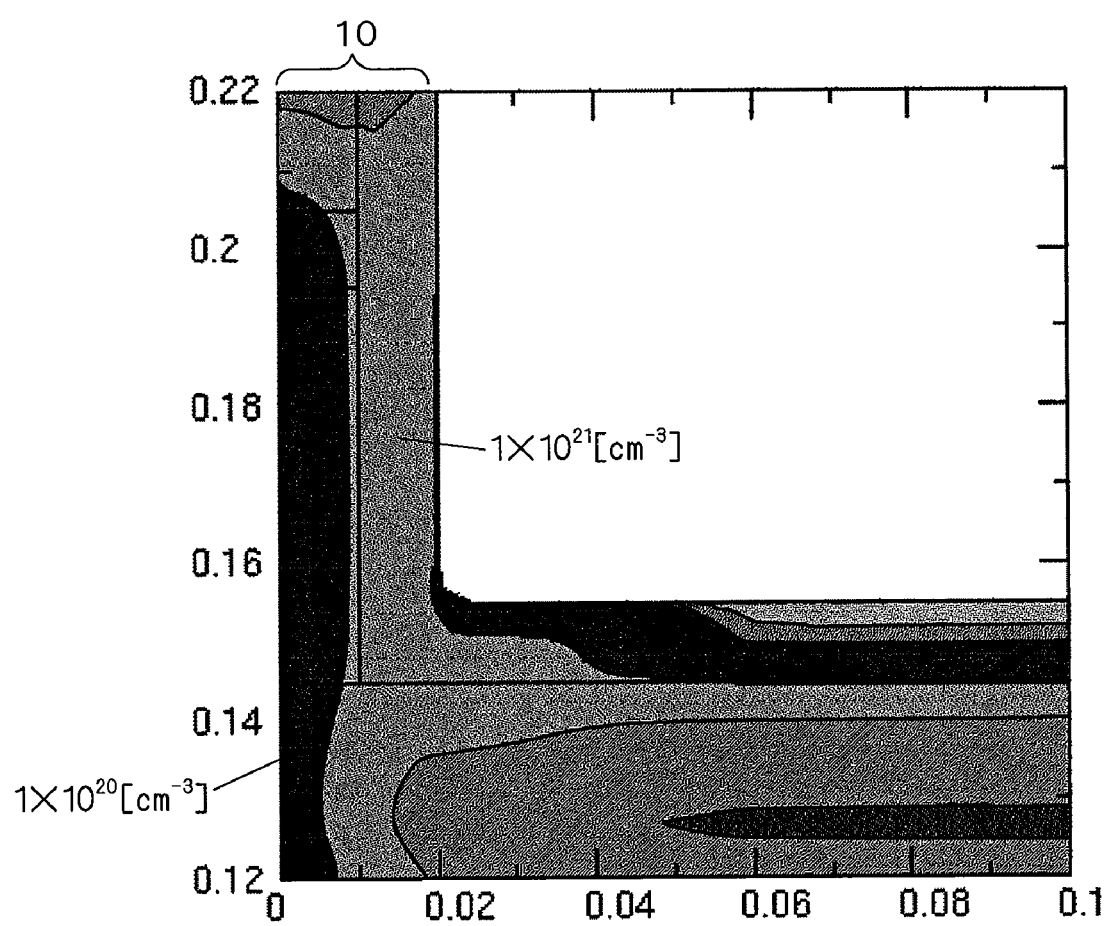

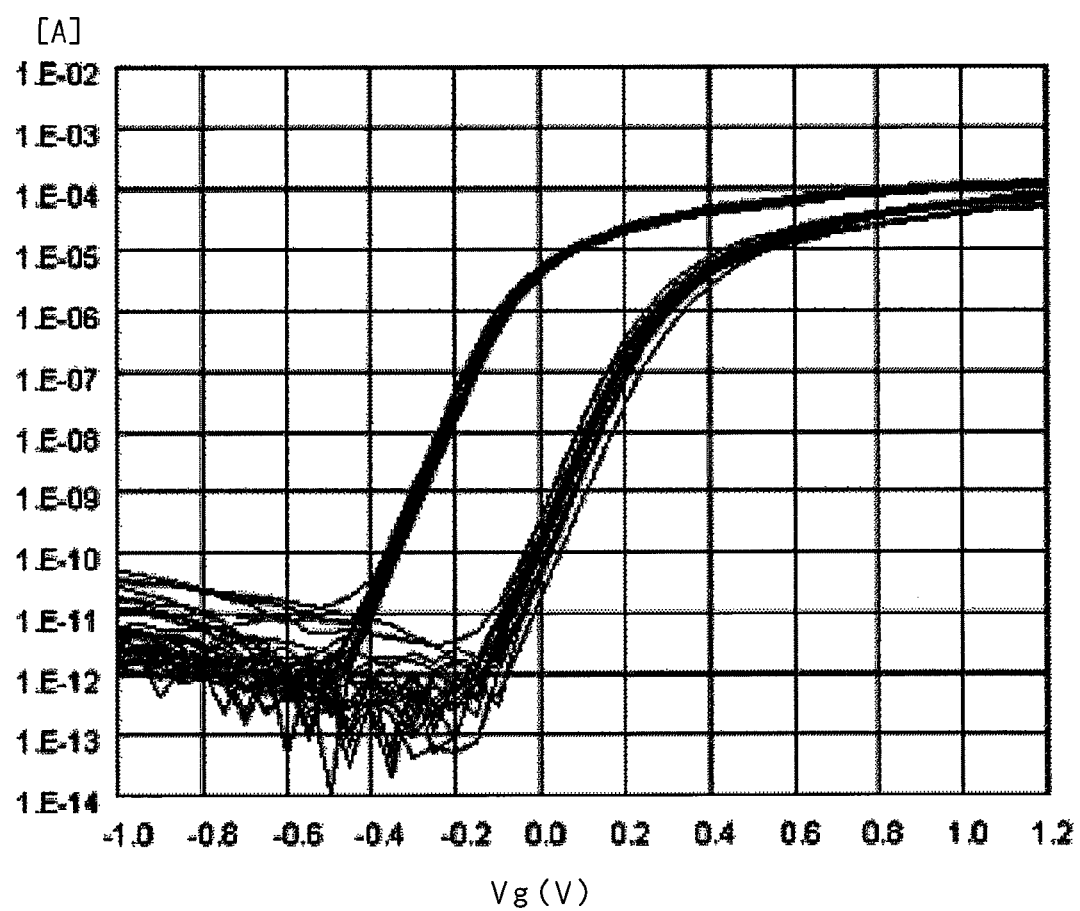

SEMICONDUCTOR DEVICE AND METHOD FOR MANUFACTURING THE SAME

BACKGROUND OF THE INVENTION

1. Field of the Invention

The present invention is one relating to a semiconductor device and a method for manufacturing the same, and more particularly to a semiconductor device having a fin-shaped semiconductor portion and a method for manufacturing the same.

2. Description of the Background Art

In recent years, miniaturization of transistors is performed in order to advance high integration of LSI, a semiconductor device. However, conventional planar transistors face their physical limitation, and the development of new transistor structures other than planar transistors is necessary for miniaturization of transistors. One of newly developed transistor structures is a fin-type transistor of a vertical structure, which is disclosed in Japanese Patent Application Laid-Open Nos. 2005-294789 and 2007-35957.

Regarding the fin-type transistor, a technique of forming this transistor on a bulk silicon wafer or an SOI (Silicon on Insulator) wafer is generally known. In particular, it is known that a fin-type transistor formed on an SOI wafer is advantageous for high integration and, in addition, can suppress the short channel effects. In contrast, although a fin-type transistor formed on a bulk silicon wafer has an advantage of allowing the fin-type transistor to be formed at low cost, it requires optimization of impurity profiles in a silicon layer under a fin-shaped semiconductor portion and suppression of the short channel effects is difficult.

A fin-type transistor is advantageous for high integration of a semiconductor device, and a fin-type transistor formed on an SOI wafer has the effect of suppressing short channel effects. However, the fin-type transistor has difficulty in element formation from the viewpoint of processes, compared to a planar transistor. This causes various problems with the fin-type transistor. In particular, processing a fin-shaped semiconductor portion and a gate electrode is difficult, and thus forming the fin-shaped semiconductor portion and the gate electrode with high precision is an important factor for improvement of characteristics of the fin-type transistor. It is also desired that variations in characteristics among elements of the fin-type transistor are suppressed.

SUMMARY OF THE INVENTION

An object of the present invention is to provide a semiconductor device having a fin-type transistor that is excellent in characteristics by forming a fin-shaped semiconductor portion and a gate electrode with high precision or by making improvement regarding variations in characteristics among elements.

A semiconductor device according to one embodiment of the invention includes a fin-shaped semiconductor portion having a source region formed on one side thereof and a drain region formed on the other side thereof, and a gate electrode formed between the source region and the drain region to surround the fin-shaped semiconductor portion with a gate insulating film interposed therebetween. Further, the gate electrode uses a metal material or a silicide material that is wet etchable.

In a semiconductor device according to one embodiment of the invention, since the gate electrode uses a metal material or a silicide material that is wet etchable, channel impurities can be set at a low concentration, so that improvement can be made regarding variations in characteristics among elements.

A semiconductor device according to another embodiment of the invention includes a fin-shaped semiconductor portion having a source region formed on one side thereof and a drain region formed on the other side thereof, and a gate electrode formed between the source region and the drain region to surround the fin-shaped semiconductor portion with a gate insulating film interposed therebetween. This semiconductor device further includes a first dummy pattern provided upon forming of the fin-shaped semiconductor portion, and a second dummy pattern provided upon forming of the gate electrode.

The semiconductor device according to another embodiment of the invention further includes the first dummy pattern provided upon forming of the fin-shaped semiconductor portion and the second dummy pattern provided upon forming of the gate electrode, and thus the fin-shaped semiconductor portion and the gate electrode can be formed with high precision.

A method for manufacturing a semiconductor device according to one embodiment of the invention is a method for manufacturing a semiconductor device including a fin-shaped semiconductor portion having a source region formed on one side thereof and a drain region formed on the other side thereof, and a gate electrode formed between the source region and the drain region to surround the fin-shaped semiconductor portion with a gate insulating film interposed therebetween. The method for manufacturing a semiconductor device according to one embodiment of the invention includes the steps of forming an insulating film on a semiconductor layer and further forming a film of amorphous silicon, patterning the amorphous silicon in a predetermined shape and performing a short-time thermal treatment on the amorphous silicon to crystallize the amorphous silicon, forming a sidewall on a side face of the amorphous silicon crystallized, and sequentially etching the insulating film and the semiconductor layer, using as a mask the sidewall from which the amorphous silicon is removed, to form the fin-shaped semiconductor portion.

The method for manufacturing a semiconductor device according to one embodiment of the invention patterns the amorphous silicon in a predetermined shape and further performs a short-time thermal treatment on the amorphous silicon to crystallize the amorphous silicon, forming a sidewall on a side face of the crystallized amorphous silicon, and forming a fin-shaped semiconductor portion based on the sidewall, and thus the fin-shaped semiconductor portion can be formed with high precision.

A method for manufacturing a semiconductor device according to one embodiment of the invention includes a fin-shaped semiconductor portion having a source region formed on one side thereof and a drain region formed on the other side thereof, and a gate electrode formed between the source region and the drain region to surround the fin-shaped semiconductor portion with a gate insulating film interposed therebetween. The method for manufacturing a semiconductor device according to one embodiment of the invention includes the steps of sequentially laminating polysilicon, an insulating film and a carbon hard mask on the fin-shaped semiconductor portion with the gate insulating film interposed therebetween, implanting an inactive ion into the carbon hard mask under a condition that the inactive ion does not reach the insulating film below the carbon hard mask, patterning the carbon hard mask into which the inactive ion has been implanted in a predetermined shape with a resist, and sequentially etching the insulating film and the polysilicon by using the carbon hard mask patterned to form the gate electrode.

The method for manufacturing a semiconductor device according to one embodiment of the invention implants an inactive ion into the carbon hard mask under a condition that the inactive ion does not reach the insulating film below the carbon hard mask, and sequentially etching the insulating film and the polysilicon by using the carbon hard mask to form the gate electrode, and thus the gate electrode can be formed with high precision.

A method for manufacturing a semiconductor device according to one embodiment of the invention includes a fin-shaped semiconductor portion having a source region formed on one side thereof and a drain region formed on the other side thereof, and a gate electrode formed between the source region and the drain region to surround the fin-shaped semiconductor portion with a gate insulating film interposed therebetween. The method for manufacturing a semiconductor device according to one embodiment of the invention implants an impurity to form a diffusion layer with control of an implanting condition so that the range of the impurity is a vicinity of an interface of the fin-shaped semiconductor portion with an oxide film formed on the fin-shaped semiconductor portion.

The method for manufacturing a semiconductor device according to one embodiment of the invention implants an impurity to form a diffusion layer with control of an implanting condition so that the range of the impurity is the vicinity of an interface of the fin-shaped semiconductor portion with an oxide film formed on the fin-shaped semiconductor portion, and thus improvement can be made regarding variations in characteristics among elements.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 16 illustrate manufacturing processes of a semiconductor device according to a first embodiment of the present invention;

FIGS. 18 to 20 illustrate dummy patterns of a semiconductor device according to a third embodiment of the invention;

FIG. 21 illustrates conditions for Ar ion implantation of a semiconductor device according to a fourth embodiment of the invention; and FIGS. 22 to 25 illustrate diffusion layer implantation of a semiconductor device according to a fifth embodiment of the invention.

DESCRIPTION OF THE PREFERRED EMBODIMENTS

First Embodiment

Figure 1:
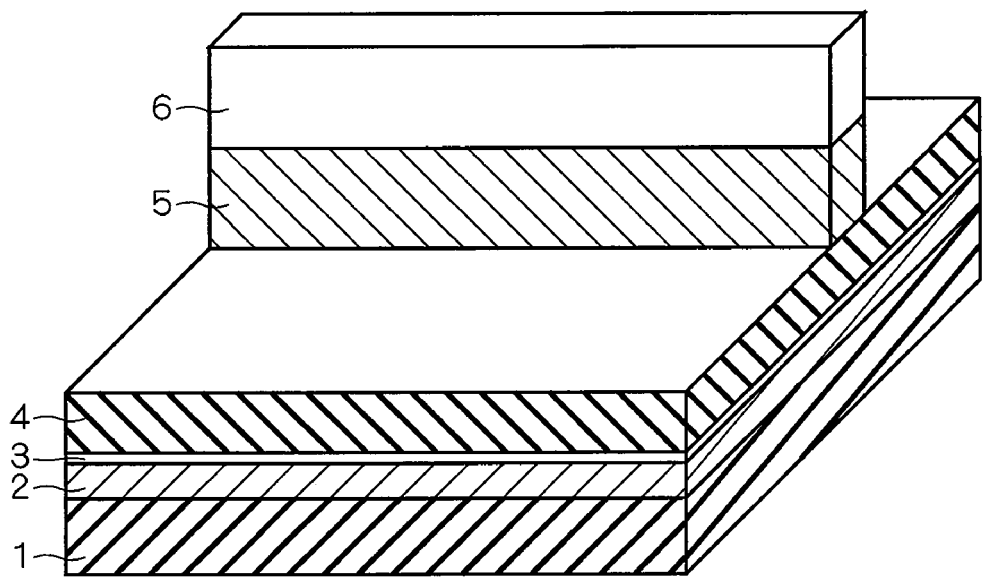

Manufacturing processes of a semiconductor device according to the present embodiment will be described below. First, as shown in FIG. 1, a semiconductor device according to the embodiment is an SOI device in which a fin-type transistor is formed on a Si substrate (not shown) having a BOX (Buried Oxide) layer 1, which is an insulating layer, and an SOI layer 2 (20 to 100 nm) laminated thereon. Laminated on the SOI layer 2 shown in FIG. 1 is a pad oxide film 3 (2 to 10 nm), and laminated on the pad oxide film 3 is a nitride film 4 (20 to 100 nm). Then, as shown in FIG. 1, polysilicon 5 (100 to 300 nm) is deposited on the nitride film 4, and thereafter the polysilicon 5 is patterned with a resist mask 6. Note that the resist mask 6 on the polysilicon 5 is removed after patterning.

Figure 2:
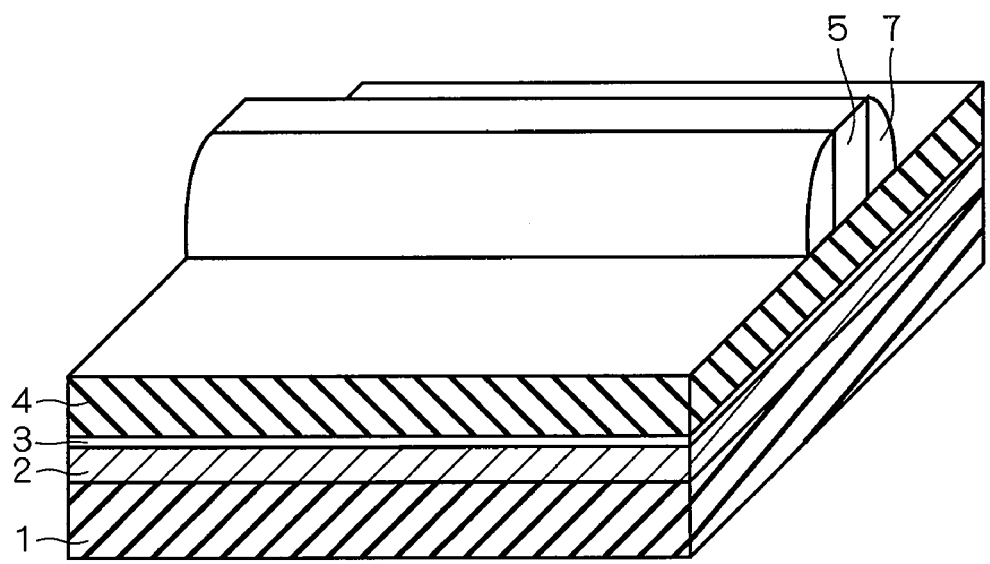

Next, as shown in FIG. 2, a TEOS (tetraethylorthosilicate) film (10 to 50 nm), which is an oxide film, is deposited on the patterned polysilicon 5, and sidewalls 7 of the TEOS film are formed on lateral walls of the polysilicon 5 by anisotropic etching. In the semiconductor device according to the embodiment, the width of the sidewalls 7 constitutes a channel width of the fin-type transistor (hereinafter also referred to as a "FIN-FET").

Thereafter, as shown in FIG. 3, the polysilicon 5 sandwiched between the sidewalls 7 is removed by wet etching and the like. Next, as shown in FIG. 4, a BARC (Bottom Anti-Reflection Coating) film 8 is applied onto the nitride film 4 including the sidewalls 7, and further a resist 9 is applied onto the BARC film 8. Then, the resist 9 is patterned by using a first mask pattern that is formed to hide a source region and a drain region of the FIN-FET.

Figure 5:
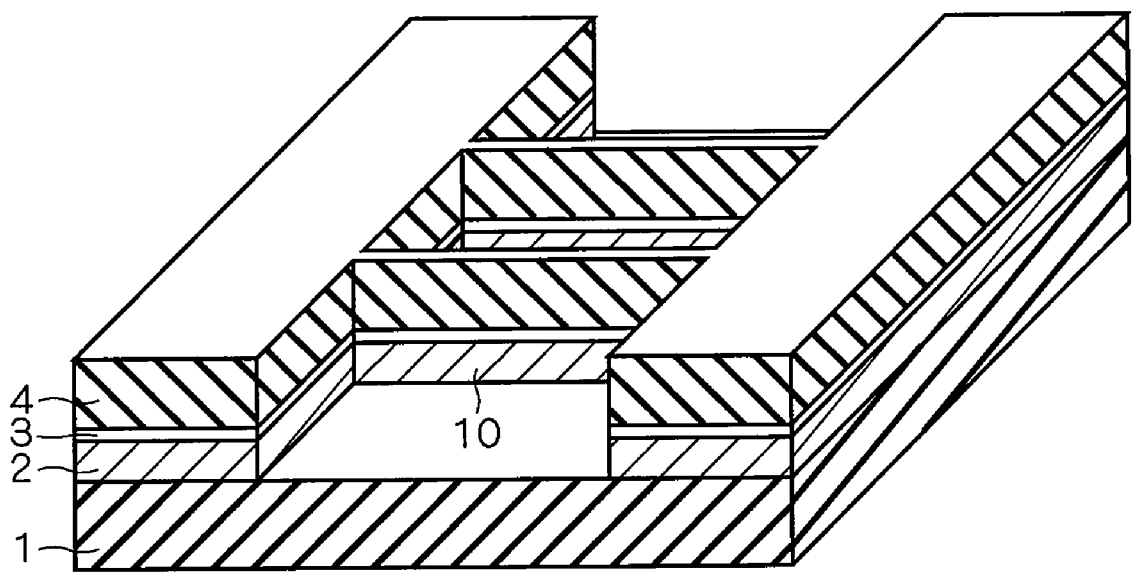

Using as a mask the resist 9 patterned as shown in FIG. 4, the nitride film 4 and other films in an area without the resist 9 are etched. Since the sidewalls 7 other than the resist 9 serve as the mask in etching of the nitride film 4, the fin-shaped semiconductor portion 10 as shown in FIG. 5 is formed. After etching of the nitride film 4, further the pad oxide film 3 and the SOI layer 2 are etched and then the resist and the BARC film 8 are removed.

Figure 6:
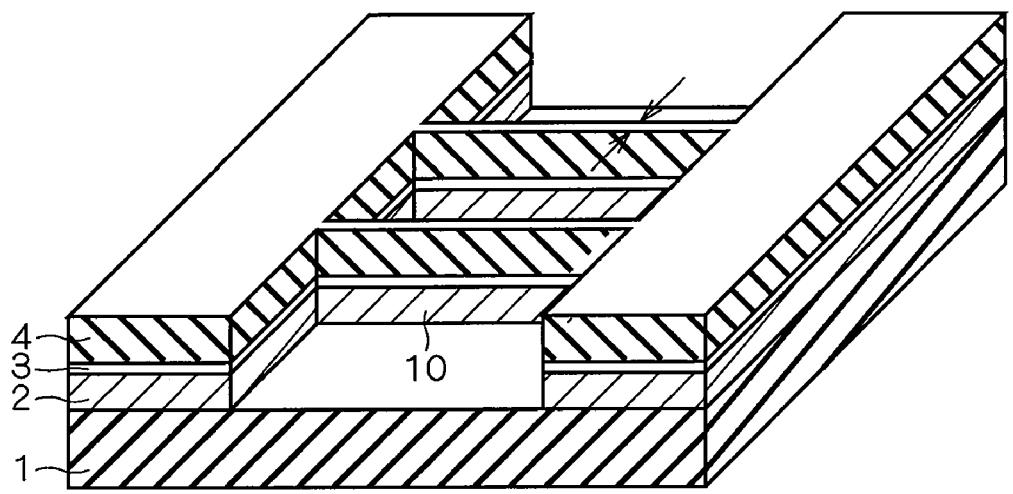

Next, as shown in FIG. 6, the surface (side face) of the fin-shaped semiconductor portion 10 is cleaned, and then a gate insulating film (not shown) is formed on the surface of the fin-shaped semiconductor portion 10. After the gate insulating film is formed, polysilicon to be used as a gate material is deposited over the entire surface. The width of the fin-shaped semiconductor portion 10 indicated by arrows in FIG. 6 is the channel width of the FIN-FET.

Figure 7:
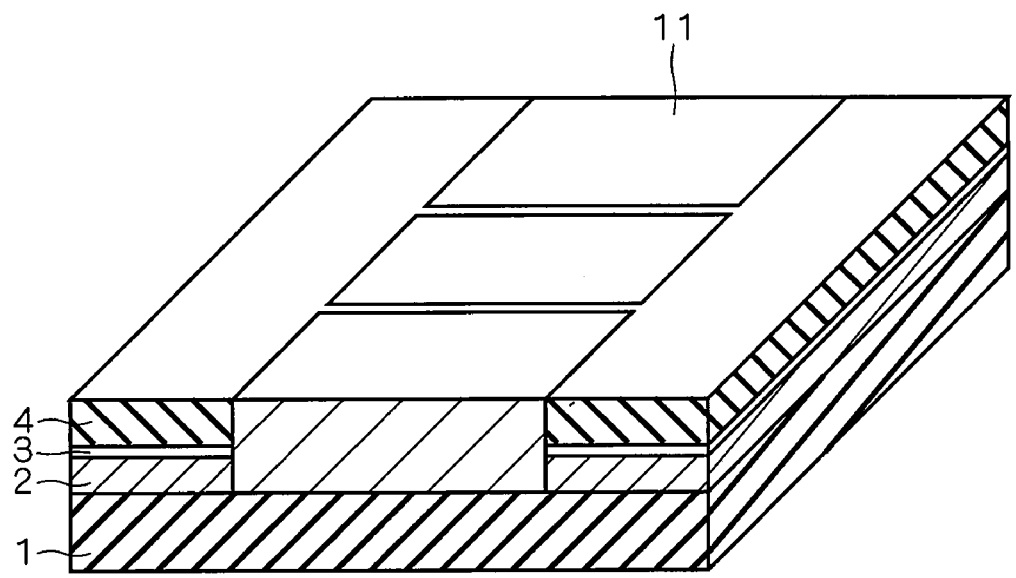

Next, the polysilicon 11 is formed on the nitride film 4 including the fin-shaped semiconductor portion 10, and is processed such that the polysilicon 11 is flattened by CMP (Chemical Mechanical Polishing) until the nitride film 4 is exposed as shown in FIG. 7.

Here, it is known that characteristics of the FIN-FET are greatly affected by a surface treatment of the fin-shaped semiconductor portion 10. Therefore, in the semiconductor device according to the embodiment, in order to suppress the mobility degradation of a transistor, improvement is made for the surface of the fin-shaped semiconductor portion 10 in which damage caused by etching remains. Specifically, a treatment in a combination of sacrificial oxidation (900 to 1250° C.) and low-temperature annealing (about 400° C.), removal of the surface by wet etching, low-damage dry etching and the like, hydrogen annealing (about 800° C.), and others is effective for the surface of the fin-shaped semiconductor portion 10 before a gate insulating film is formed.

Figure 8:
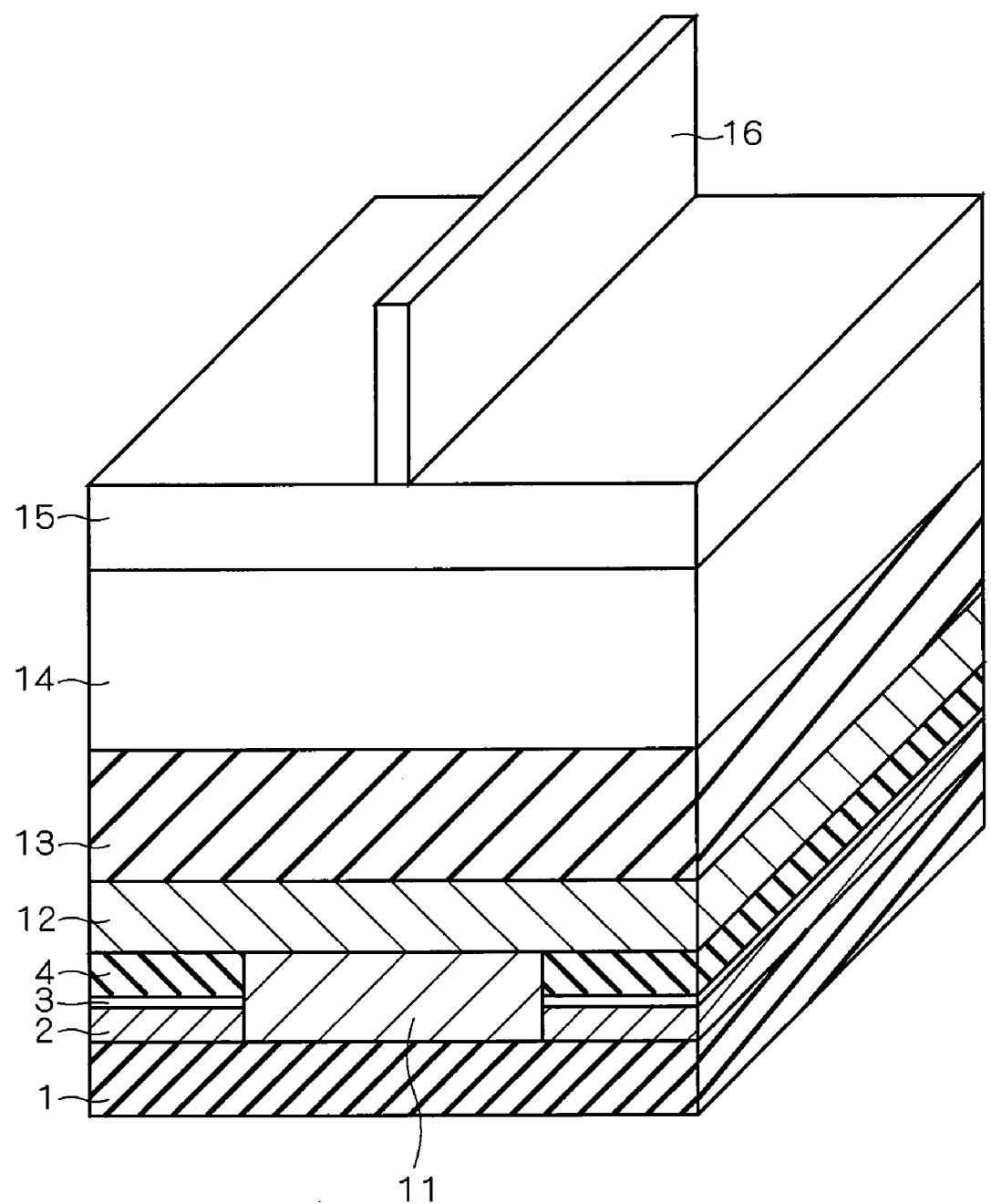
Figure 9:
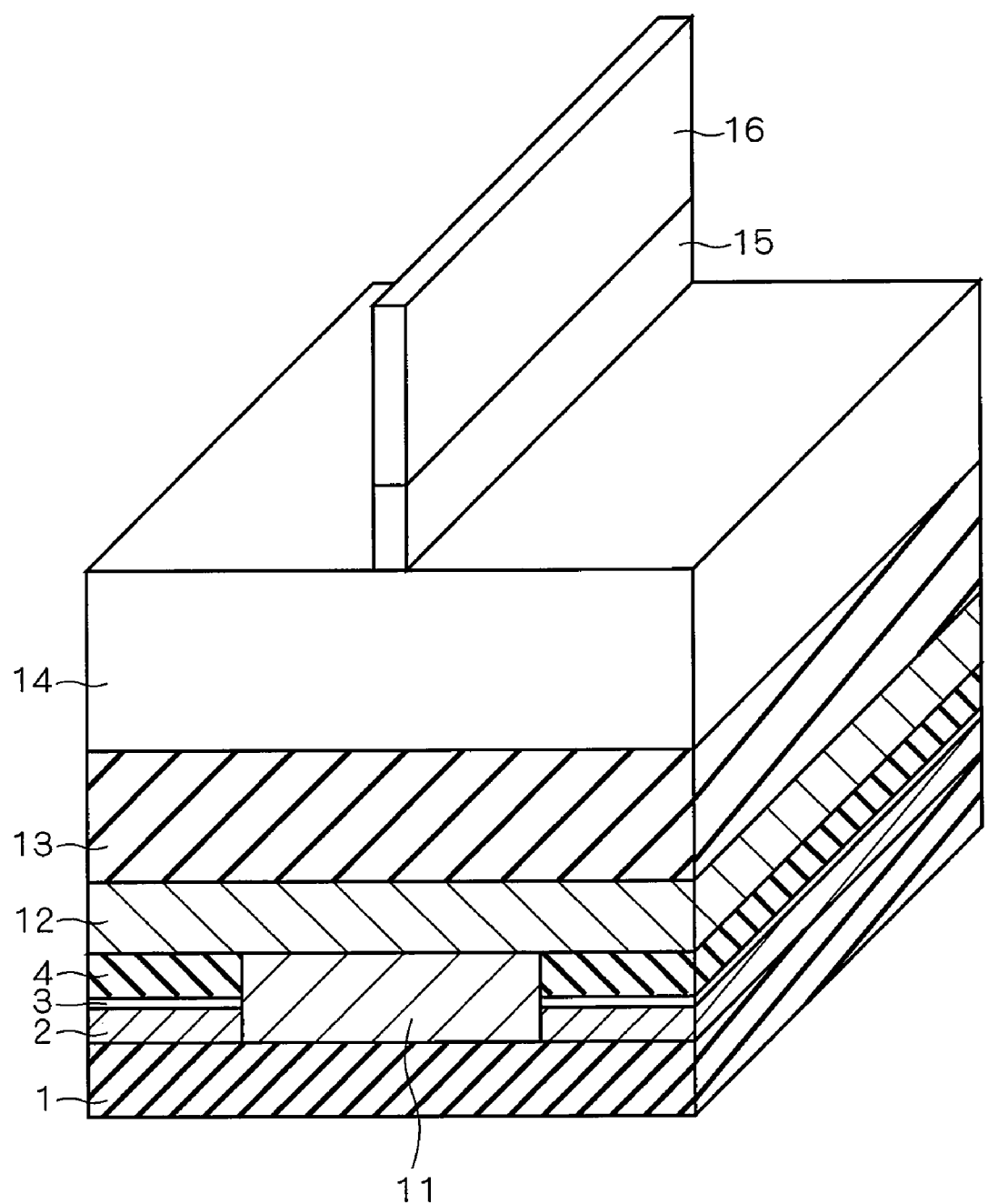
Figure 10:
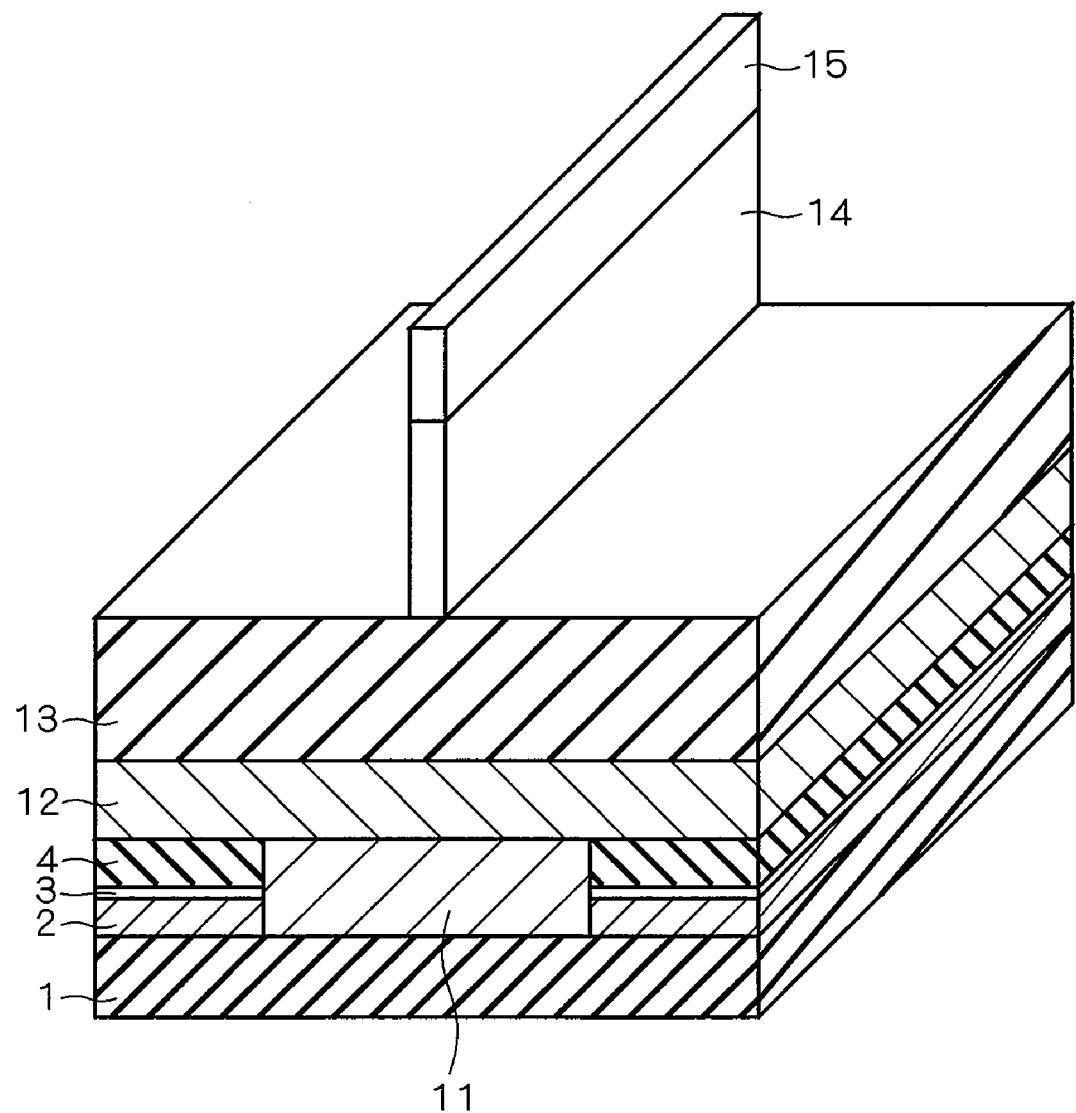
Figure 11:
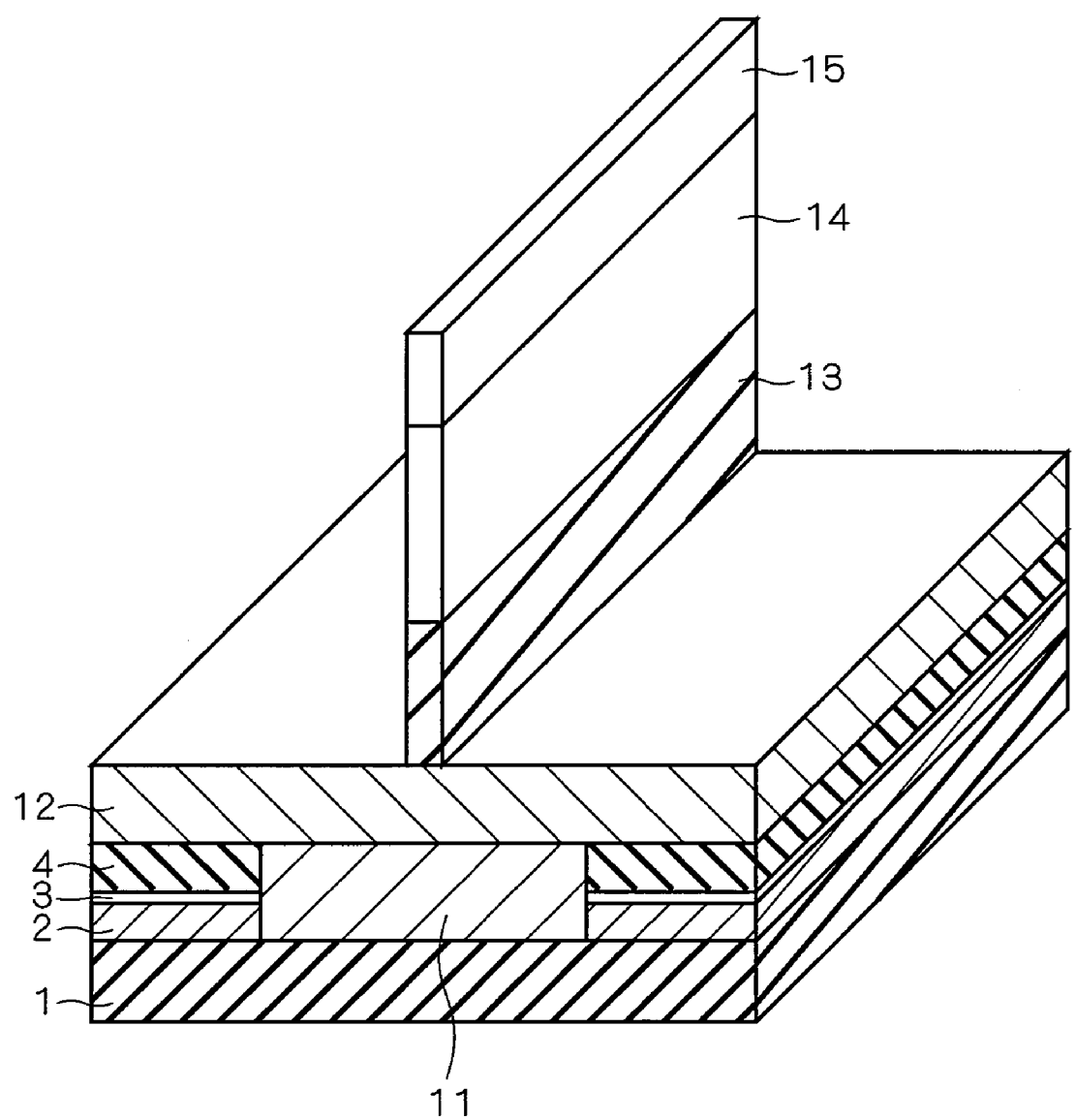

Next, as shown in FIG. 8, polysilicon 12 is laminated again on the flattened polysilicon 11 and the nitride film 4. Sequentially laminated on the polysilicon 12 are a nitride film 13 (50 to 200 nm), a C-HM (hard mask containing carbon) layer 14 (100 to 400 nm), an intermediate layer 15 containing silicon, and a resist (ArF) 16. First, the resist 16 is patterned in a shape shown in FIG. 8 by using a second mask pattern in order to form a gate. Then, as shown in FIG. 9, the intermediate layer 15 is etched by using the patterned resist 16 as a mask. Further, as shown in FIG. 10, the C-HM layer 14 is etched using the patterned intermediate layer 15 as a mask. Then, as shown in FIG. 11, the nitride film 13 on the polysilicon 12 is etched using the patterned C-HM layer 14 as a mask.

Figure 13:
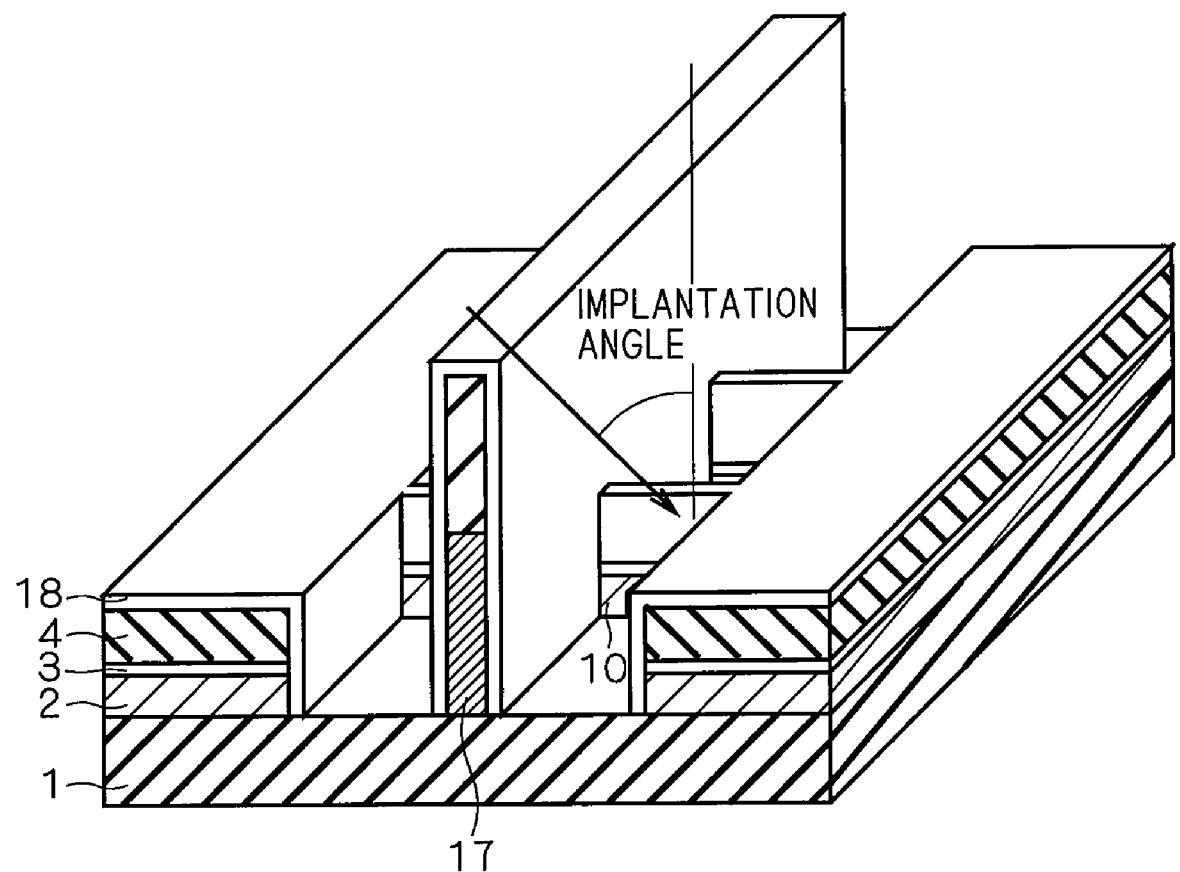

Further, as shown in FIG. 12, the polysilicon 11 and 12 is etched by using the patterned nitride film 13 as a mask to form a gate electrode 17. Then, as shown in FIG. 13, an oxide film 18 (e.g., a TEOS film having a film thickness of 10 nm) is deposited over the entire surface after removal of the C-HM layer 14. Further, impurities are implanted over the oxide film 18 into the source region and the drain region, as diffusion layer (EXT) implantation and Halo implantation.

Specifically, conditions for EXT implantation for NMOS are that implantation ions are arsenic, implantation energy is 5 to 40 KeV, implantation quantity is about 0.1 to $1 \times 10^{15}$ $cm^{-2}$, an implantation angle is 7 to 60 degrees, and an offset angle is 0 degree. Conditions for Halo implantation for NMOS are that the implantation ions are boron, the implantation energy is 5 to 8 KeV, the implantation quantity is about 0.1 to $4 \times 10^{13}$ $cm^{-2}$, the implantation angle is 7 to 60 degrees, and the offset angle is 45 degrees.

After the implantation for NMOS, spike annealing at 700 to 1000° C. is performed and then implantation for PMOS is performed. Conditions for EXT implantation for PMOS are that the implantation ions are boron, the implantation energy is 5 to 40 KeV, the implantation quantity is about 0.1 to $4 \times 10^{15}$ $cm^{-2}$, the implantation angle is 7 to 60 degrees, and the offset angle is 0 degree. Conditions for Halo implantation for PMOS are that the implantation ions are phosphorus, the implantation energy is 5 to 40 KeV, the implantation quantity is about 0.1 to $4 \times 10^{13}$ $cm^{-2}$, the implantation angle is 7 to 60 degrees, and the offset angle is 45 degrees.

In the embodiment, implantation for NMOS and implantation for PMOS are performed over the oxide film 18, allowing reduction of damage to the gate insulating film caused by implantation. This damage reduction improves reliability of the gate insulating film.

Figure 14:
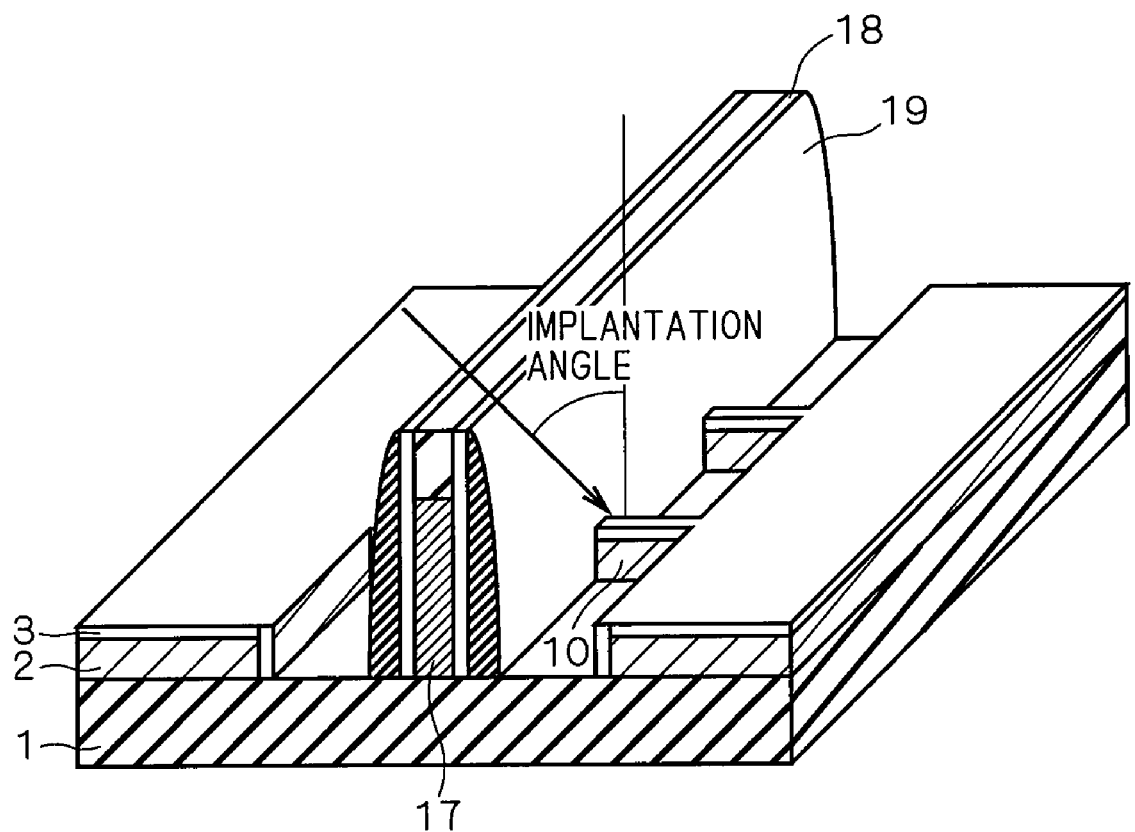

Next, sidewalls 19 (about 30 nm) of a nitride film as shown in FIG. 14 are formed on the side face of the formed gate electrode 17. Then, implantation into source and drain regions of PMOS and NMOS is performed, and spike annealing at 1000 to 1100° C. is performed as annealing for activation of impurities. Note that in the FIN-FET shown in FIG. 14, the oxide film 18 on the source region, the drain region and the gate is removed.

Specifically, conditions for source and drain implantation for PMOS are that the implantation ions are boron, the implantation energy is 5 to 40 KeV, the implantation quantity is about 1 to $5 \times 10^{15}$ $cm^{-2}$, the implantation angle is 7 to 60 degrees, and the offset angle is 0 degree. Alternatively, the implantation ions are boron, the implantation energy is 1 to 20 KeV, the implantation quantity is about 1 to $5 \times 10^{15}$ $cm^{-2}$, the implantation angle is 7 to 60 degrees, and the offset angle is 0 degree. On the other hand, conditions for source and drain implantation for NMOS are that the implantation ions are arsenic, the implantation energy is 5 to 40 KeV, the implantation quantity is about 1 to $5 \times 10^{15}$ $cm^{-2}$, the implantation angle is 7 to 60 degrees, and the offset angle is 0 degree. Alternatively, the implantation ions are boron, the implantation energy is 5 to 40 KeV, the implantation quantity is about 1 to $5 \times 10^{15}$ $cm^{-2}$, the implantation angle is 7 to 60 degrees, and the offset angle is 0 degree.

Figure 15:
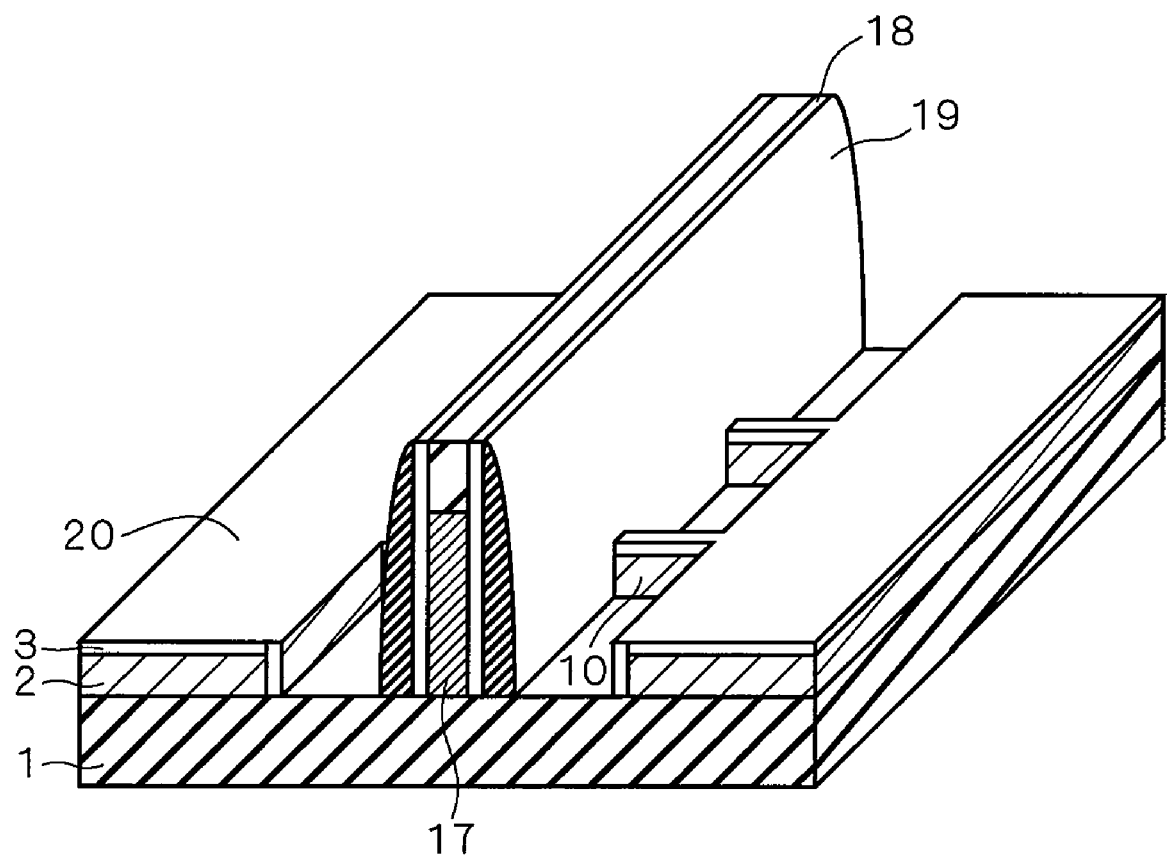
Figure 16:
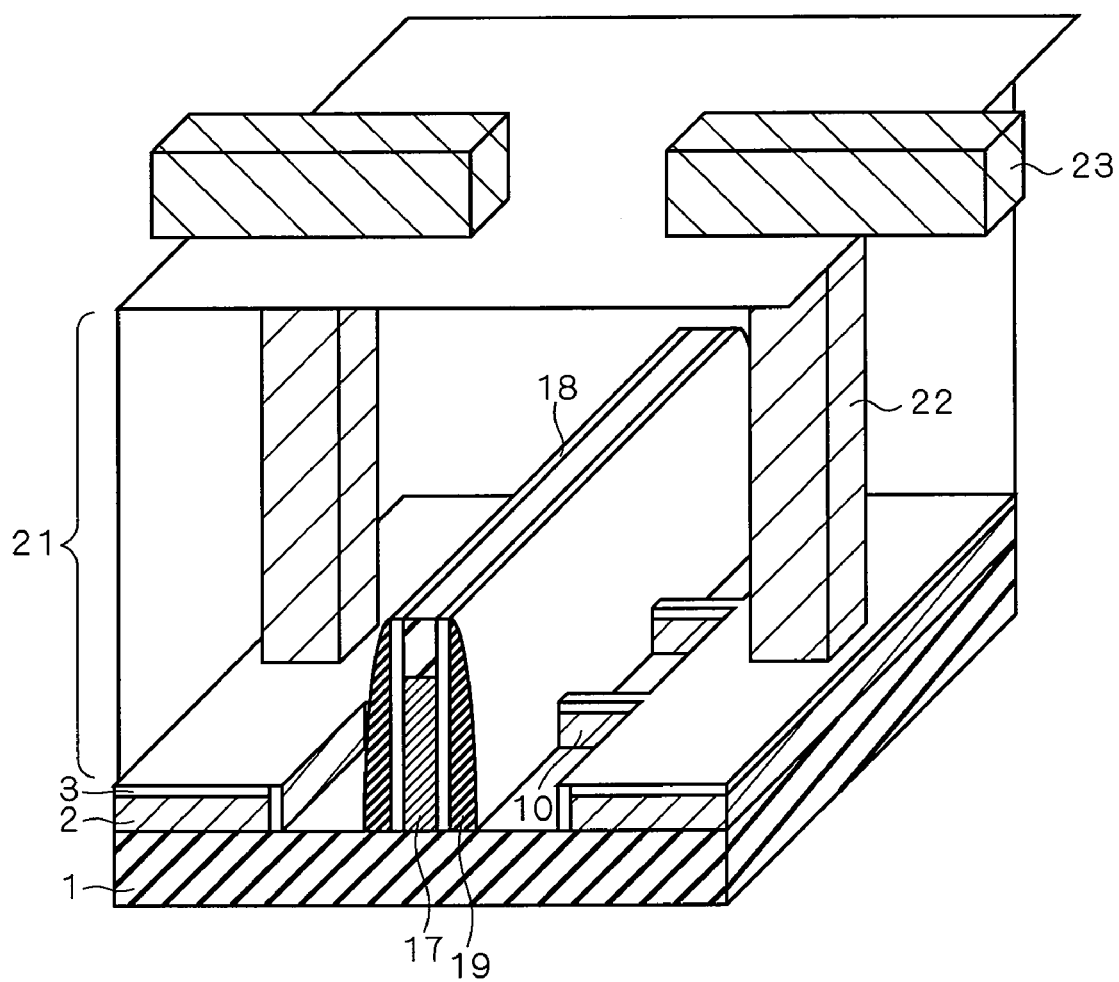

Next, for the purpose of decreasing the resistance in the source region and the drain region, a Ni film 20 (5 to 20 nm) is sputtered in the source region and the drain region to form a silicide film, as shown in FIG. 15. Then, as shown in FIG. 16, a nitride film (not shown) serving as a stopper for contact formation and an interlayer oxide film 21 are deposited over the entire surface including the source region, the drain region, the gate electrode 17 and the like. The interlayer oxide film 21 is flattened by CMP and thereafter contacts 22 are opened, and the contacts 22 are filled with tungsten. The contacts 22 are connected with Cu interconnections 23 as shown in FIG. 16. As described above, through manufacturing processes shown in FIGS. 1 to 16, the FIN-FET is completed.

Figure 17A:
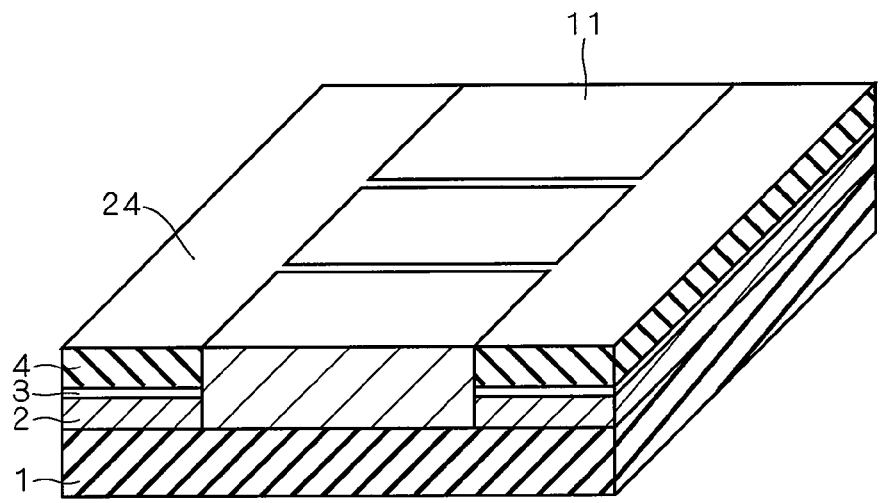
FIGS. 17A, 17B and 17C illustrate a gate electrode of the semiconductor device according to the first embodiment of the invention.

Further, in a semiconductor device according to the embodiment, it is conceivable to use a metal material of TiN, Ti, W or the like or a silicide material such as NiSi, instead of polysilicon 11 and 12, as a material of the gate electrode 17. Note that the material of the gate electrode 17 is not limited to the examples mentioned above, and may be a material having a work function of approximately 4.4 to 4.8 eV. FIG. 17A shows that after the manufacturing process of FIG. 6, a TiN film 24 is formed on the nitride film 4 including the fin-shaped semiconductor portion 10, further a film of the polysilicon 11 is formed on the TiN film 24, and then the polysilicon 11 and the TiN film 24 are polished by CMP.

Figure 17B:
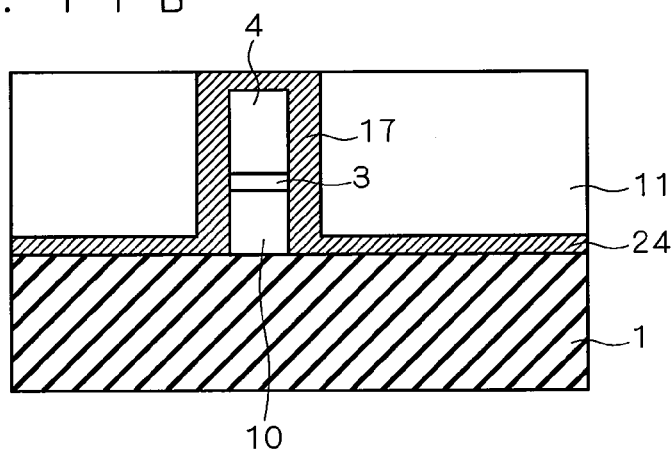
Figure 17C:
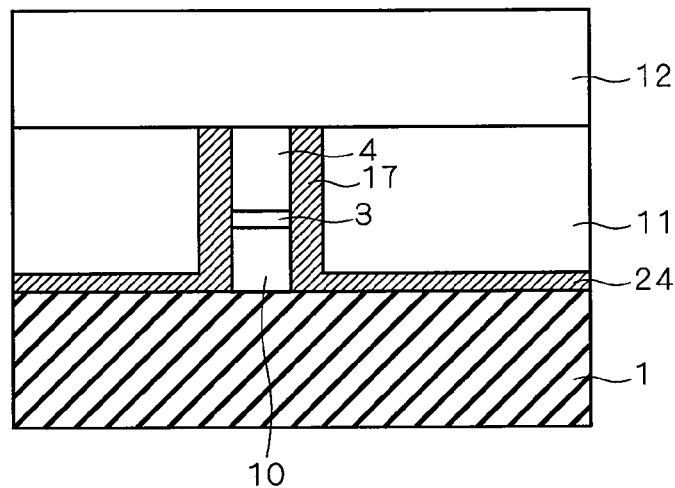

FIG. 17B is a sectional view of the fin-shaped semiconductor portion 10 of FIG. 17A, showing the gate electrode 17 formed of the TiN film 24 to surround the fin-shaped semiconductor portion 10. In this FIG. 17B, the TiN film 24 of the gate electrode 17 above the fin-shaped semiconductor portion 10 (above the fin-shaped nitride film 4) is made thin due to the CMP process. However, the present invention is not limited thereto, but may be without the TiN film 24 in the portion in question as in FIG. 17C. Conditions under which the TiN film 24 in the portion in question is eliminated can rather make the CMP process stable. Manufacturing processes shown in FIG. 17A and the subsequent drawings are the same as those shown in FIG. 8 and the subsequent drawings. As shown in FIG. 17C, a film of the polysilicon 12 is formed on the polysilicon 11 and the TiN film 24.

In consideration of the material of the gate electrode 17 regarding processing processes, dry etching is performed for the polysilicon 11 and 12 and wet etching is performed for a metal material or a silicide material, which is the material of the gate electrode 17. Therefore, a metal material or a silicide material used for the material of the gate electrode 17 is preferably one that is easy for wet etching. Note that since etching is performed by using polysilicon as a mask for processing of the gate electrode 17, acid such as sulfuric acid and hydrochloric acid and a mixed liquid thereof are preferable as an etchant. Further, in cleaning after wet etching, using an ammonia-hydrogen peroxide mixed liquid (APM) or a hydrochloric acid-hydrogen peroxide mixed liquid (HPM) is preferable in order to prevent metal such as Ti from adhering onto the surface of a silicon wafer.

In a semiconductor device according to the embodiment, a High-K insulating film may be used as the gate insulating film. As the specific material for the High-K insulating film, there are HFSiON (hafnium silicate nitride) and the like. The High-K insulating film is formed by ordinary deposition methods such as chemical vapor deposition (CVD), low pressure CVD, physical vapor deposition (PVD).

As described above, a semiconductor device according to the embodiment allows channel impurities to be set at a low concentration by using a metal material such as TiN or a silicide material such as NiSi having a low resistance as a material of the gate electrode 17 or using a High-K insulating film as the gate insulating film, so that a FIN-FET having a threshold voltage of 0.2 to 0.6 V can be formed. It should be noted that setting channel impurities at a low concentration has an advantage that improvement can be made regarding variations in characteristics among elements.

It should be noted that although in a semiconductor device according to the embodiment, description has been given on a FIN-FET formed on the SOI layer 2 as shown in FIG. 1 and other drawings. However, the present invention is not limited thereto, but there may be a FIN-FET formed on a bulk silicon wafer. Also, in a semiconductor device according to the embodiment, the pad oxide film 3 and the nitride film 4 are provided on the SOI layer 2 to form a FIN-FET. However, the invention is not limited thereto, but a FIN-FET may be formed on the SOI layer 2 without the pad oxide film 3 and the nitride film 4.

Second Embodiment

As shown in the first embodiment, in a semiconductor device according to the invention, the fin-shaped semiconductor portion 10 is patterned by etching with the sidewalls 7 of oxide films used as masks (FIGS. 2 to 5). This is because there is an advantage that the width of the fin-shaped semiconductor portion 10 can be made more uniform than that of the ordinary fin-shaped semiconductor portion 10 that is formed by exposing a resist to light. In other words, manufacturing processes shown in the first embodiment have an advantage that the width of the fin-shaped semiconductor portion 10 can be controlled by means of the film thickness of an insulating film that is to be the sidewalls 7, allowing suppression of variations in width in the fin-shaped semiconductor portion 10.

Even by the use of the manufacturing processes, however, the sidewalls 7 are formed using the polysilicon 5 as the base. Accordingly, roughness of lateral walls formed upon patterning of the polysilicon 5 becomes roughness of the fin-shaped semiconductor portion 10 in its original state. If the roughness of the fin-shaped semiconductor portion 10 is large, variations in transistor characteristics are large.

Manufacturing processes for improvement regarding roughness of the fin-shaped semiconductor portion 10 will be described in the present embodiment. As a first manufacturing process, amorphous silicon, instead of the polysilicon 5 on the nitride film 4 shown in FIG. 1, is deposited and patterned in a predetermined shape. Then, a short-time thermal treatment is performed by RTA (Rapid Thermal Anneal) before depositing an oxide film that is to be the sidewalls 7, thereby crystallizing the amorphous silicon.

Next, as a second manufacturing process, polysilicon or amorphous silicon is deposited on the nitride film 4 shown in FIG. 1 to reduce unevenness of the surface of the polysilicon or the amorphous silicon. Reducing unevenness of the surface of the polysilicon or the amorphous silicon to secure its uniformity improves uniformity of etching of the sidewalls 7. Thus, improvement is made regarding roughness of the fin-shaped semiconductor portion 10. As a method for reducing unevenness of the surface polysilicon or amorphous silicon, for example, there are methods such as CMP and sacrificial oxidation.

Specific description will be given on a method of sacrificial oxidation. Amorphous silicon is deposited on the nitride film 4 shown in FIG. 1, and the surface of the amorphous silicon is sacrificially oxidized. Thereafter, an oxide film resulting from the sacrificial oxidation is removed and the amorphous silicon is patterned in a shape like the polysilicon 5 in FIG. 1. The roughness of the fin-shaped semiconductor portion 10 utilizing this method is 2.1 nm at 3 $\sigma$ ($\sigma$: standard deviation), which represents improvement as compared to 3 $\sigma$=2.5 nm in the case where sacrificial oxidation is not used.

Next, as a third manufacturing process, after polysilicon has been deposited on the nitride film 4 shown in FIG. 1, silicon ions are implanted into the surface of the film, so that the polysilicon is amorphized. Thereafter, annealing is performed, and the amorphized polysilicon is patterned in a shape as shown in FIG. 1. With this method, it is considered that improvement can be made regarding the roughness of the fin-shaped semiconductor portion 10 such that the roughness is about 2 nm at 3 $\sigma$ as with the method mentioned above. It should be noted that in the present invention, ions to be implanted are not limited to Si (silicon) but may be Ge (germanium), Ar (argon) or the like.

Third Embodiment

A semiconductor device according to the invention is a FIN-FET, which needs to be processed to become the gate electrode 17 with a high step to surround the fin-shaped semiconductor portion 10 as shown in FIG. 15 and other drawings. Therefore, pattern dimensions of the fin-shaped semiconductor portion 10 and the gate electrode 17 need to be etched with good control. To address this, in a semiconductor device according to the present embodiment, dummy patterns for processing the fin-shaped semiconductor portion 10 and dummy patterns for processing the gate electrode 17 are provided.

Specific description will be given. In the semiconductor device according to the embodiment, a process of patterning the resist 9 with a first mask pattern as shown in FIG. 4 to form the fin-shaped semiconductor portion 10 shown in FIG. 5 is needed. Further, in the semiconductor device according to the embodiment, a process is needed that patterns the resist 16 with a second mask pattern as shown in FIG. 8 to form the gate electrode 17 shown in FIG. 12. Therefore, both pattern dimensions for forming the fin-shaped semiconductor portion 10 and pattern dimensions for forming the gate electrode 17 need to be controlled, and therefore, for the first mask pattern and the second mask pattern, their respective dummy patterns are formed.

It should be noted that in a conventional MOSFET of a planar structure, there has been no variation in occupancy of polysilicon on a wafer during etching of a gate. Therefore, considering only occupancy of a mask pattern for etching the gate, dummy patterns have been generated upon creating of a mask. In the case of a FIN-FET like the semiconductor device according to the embodiment, however, occupancy of both the first mask pattern and the second mask pattern needs to be considered.

For example, as shown in FIG. 18, in a process of forming the fin-shaped semiconductor portion 10, fin dummy patterns 30 are formed upon patterning with the first mask pattern. Further, as shown in FIG. 18, in a process of forming the gate electrode 17, gate dummy patterns 31 are formed upon patterning with the second mask pattern. In particular, the fin dummy patterns 30 are provided such that they do not overlap with the pattern of the fin-shaped semiconductor portion 10, and the gate dummy patterns 31 are provided such that they are not positioned under the pattern of the fin-shaped semiconductor portion 10. The areas of the fin dummy patterns 30 are adjusted so that the total occupancy of the fin dummy patterns 30 and the pattern of the fin-shaped semiconductor portion 10 is 40 to 60%. Note that the total occupancy of the fin dummy patterns 30 and the pattern of the fin-shaped semiconductor portion 10 in FIG. 18 is represented by a ratio of the total area of the fin dummy patterns 30 and the fin-shaped semiconductor portion 10 to a region indicated by a broken line. Also, the area of the gate dummy patterns 31 is adjusted so that the total occupancy of the gate dummy patterns 31 and the pattern of the gate electrode 17 is 40 to 60%.

Figure 19:
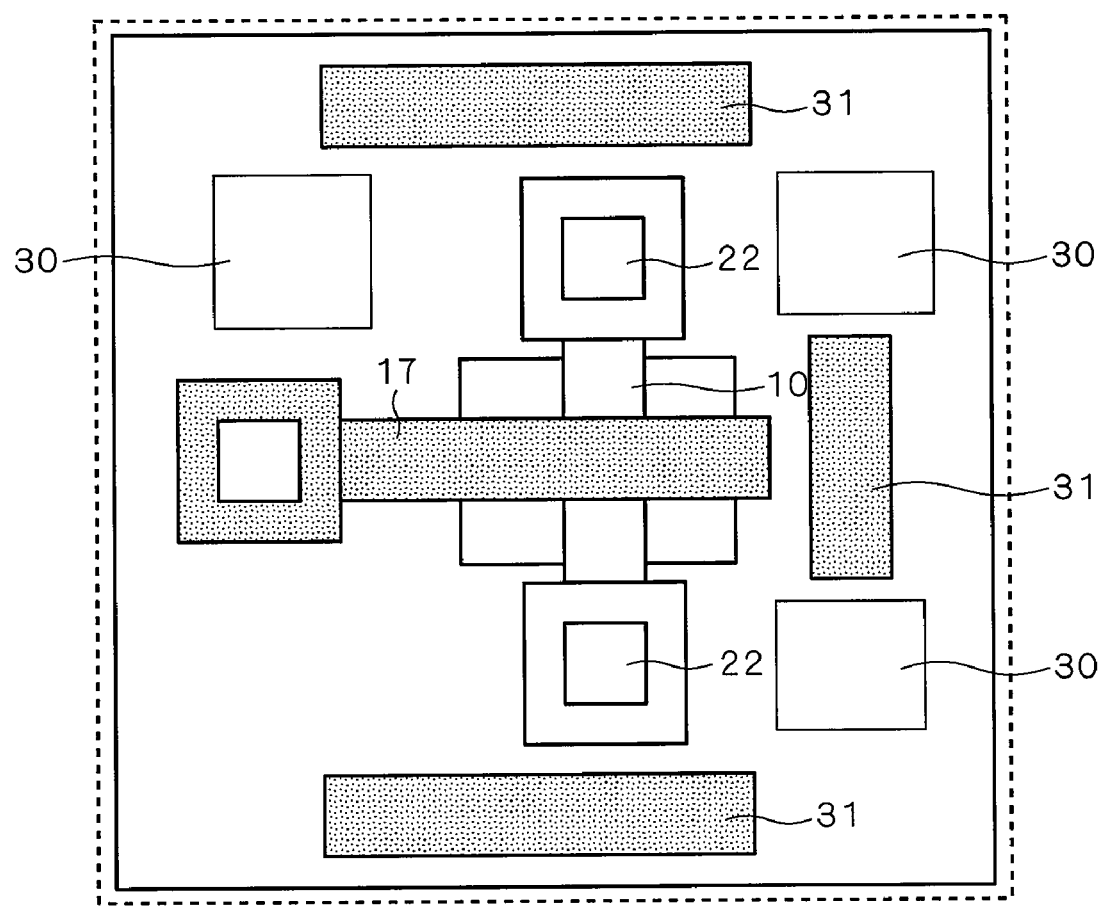
Figure 20:
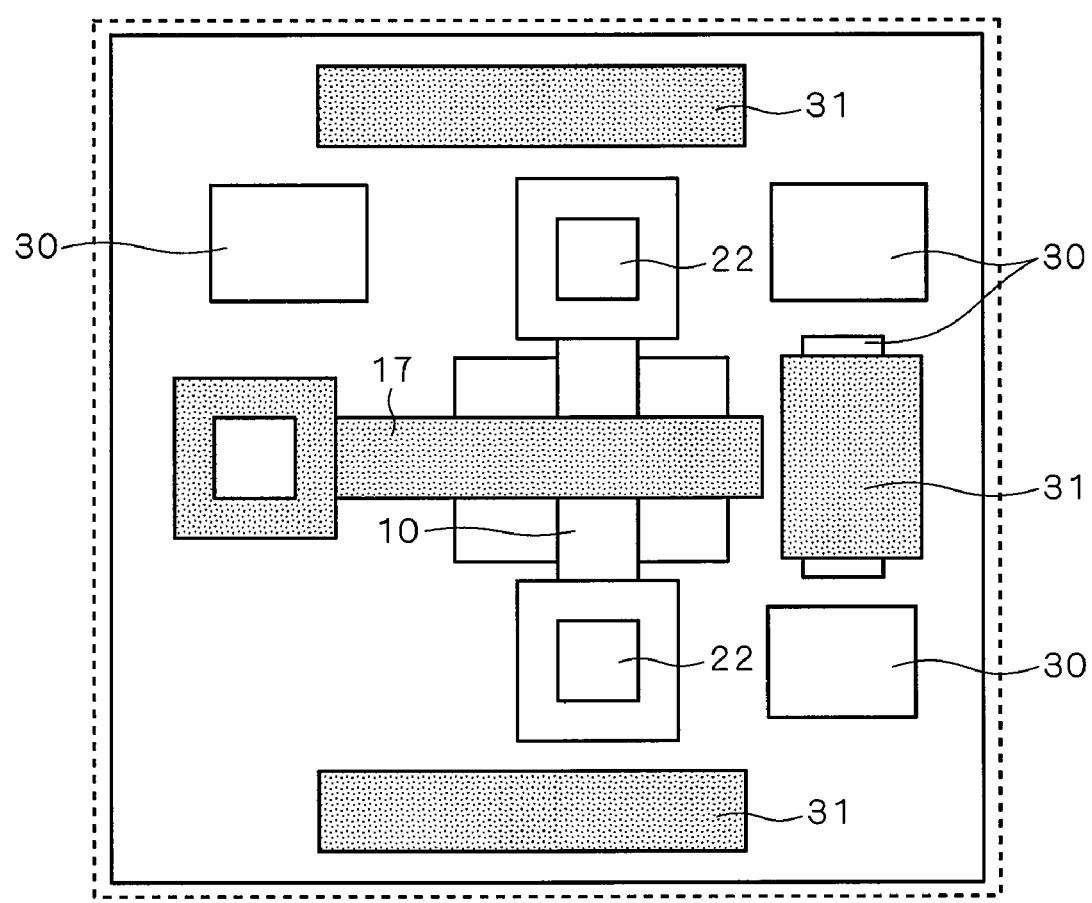

The fin dummy patterns 30 and the gate dummy patterns 31 shown in FIG. 18 have no overlap with other patterns, and therefore there is an advantage of easily calculating the area of dummy patterns. As shown in FIG. 19, the fin dummy patterns 30 are formed to be square, thereby allowing the dimension error to be reduced during light exposure. Further, as shown in FIG. 20, the fin dummy pattern 30 is formed to be positioned under the gate dummy pattern 31, thereby allowing improvement of the flexibility in arrangement of the fin dummy patterns 30 and the gate dummy patterns 31.

As described above, in the semiconductor device according to the embodiment, the fin dummy patterns 30 and the gate dummy patterns 31 are provided, allowing the pattern dimensions of the fin-shaped semiconductor portion 10 and the gate electrode 17 to be etched with good control. This allows improvement in characteristics of the semiconductor device.

Fourth Embodiment

In a semiconductor device according to the invention, a multilayered resist method using a hard mask as shown in FIG. 8 and other drawings is used, and the C-HM layer 14, which is a hard mask containing carbon, is provided, so that the gate electrode 17 with a high step is processed with high dimensional precision.

However, in order to process the gate electrode 17 with a high step with higher dimensional precision, the C-HM layer 14 is required to be a hard film.

In the semiconductor device according to the embodiment, the C-HM layer 14 becomes a hard film by implanting Ar ions into the C-HM layer 14. That is, in the embodiment, the C-HM layer 14 is formed on the nitride film 13 shown in FIG. 8 by spin coating (SOC: spin-on carbon hardmask), so that Ar ions are implanted into the C-HM layer 14. However, Ar ion implantation is performed with such energy that Ar ions do not reach the nitride film 13.

Specifically, if the C-HM layer 14 is about 150 nm, implantation energy of 40 KeV or less as shown in FIG. 21 allows Ar ions to be implanted into only the C-HM layer 14 without reaching the nitride film 13 positioned below, so that the C-HM layer 14 can be hardened. Note that in FIG. 21, assuming that the horizontal axis indicates the depth direction of the C-HM layer 14 and the vertical axis indicates the amount of implantation, results of implantation of Ar ions with implantation energy of 20 to 100 KeV are represented. Ions implanted into the C-HM layer 14 in the present invention are not limited to Ar ions, but may be inactive ions such as He ions, Ne ions, F ions, N ions, Xe ions and Kr ions.

As described above, in the semiconductor device according to the embodiment, implanting Ar ions into the C-HM layer 14 to such an extent that the Ar ions do not reach the nitride film 13. This improves process margin, allowing the gate electrode 17 with a high step to be processed with higher dimensional precision.

Fifth Embodiment

In a semiconductor device according to the invention, diffusion layer (EXT) implantation is performed as shown in FIG. 13 to reduce the parasitic resistance. However, when impurity ions are implanted in high dose, silicon crystal collapses in a region into which ions are implanted. With a bulk silicon substrate, crystallinity can be restored by activation annealing after implantation. In the case of a FIN-FET according to the invention, however, effects of activation annealing cannot be obtained because the silicon layer is thin (because the width of the fin-shaped semiconductor portion 10 is thin).

To address this, in the semiconductor device according to the embodiment, implantation conditions need to be optimized in the diffusion layer (EXT) implantation in order to maintain the crystallinity of a silicon layer in the fin-shaped semiconductor portion 10. Implantation conditions according to the embodiment are that impurity ions are implanted in a high concentration into the outermost surface and impurity ions are implanted in a low concentration into the inside of the fin-shaped semiconductor portion 10. The conditions enable the collapse of crystallinity of a silicon layer in a fin-shaped semiconductor portion to be prevented.

Specifically, as shown in FIG. 22, by implanting impurity ions at relatively low energy, e.g., 15 KeV, the inside of the fin-shaped semiconductor portion remains at a low concentration. FIG. 22 is a simulation view of diffusion layer (EXT) implantation, and the concentration of the inside of the fin-shaped semiconductor portion 10 is about $1\times10^{15}$ cm$^{-3}$, but the concentration of the outermost surface is high, about $1\times10^{21}$ cm$^{-3}$.

On the other hand, as shown in FIG. 23, when impurity ions are implanted at relatively high energy, e.g., 40 KeV, the concentration even in the inside of the fin-shaped semiconductor portion 10 is high, about $1\times10^{20}$ cm$^{-3}$. In other words, the entire fin-shaped semiconductor portion 10 shown in FIG. 23 is amorphized, and all the area into which ions are implanted by later activation annealing will be polycrystallized. If all the area into which ions are implanted is polycrystallized, a problem arises that low resistance cannot be achieved even by introducing impurities.

Figure 25:
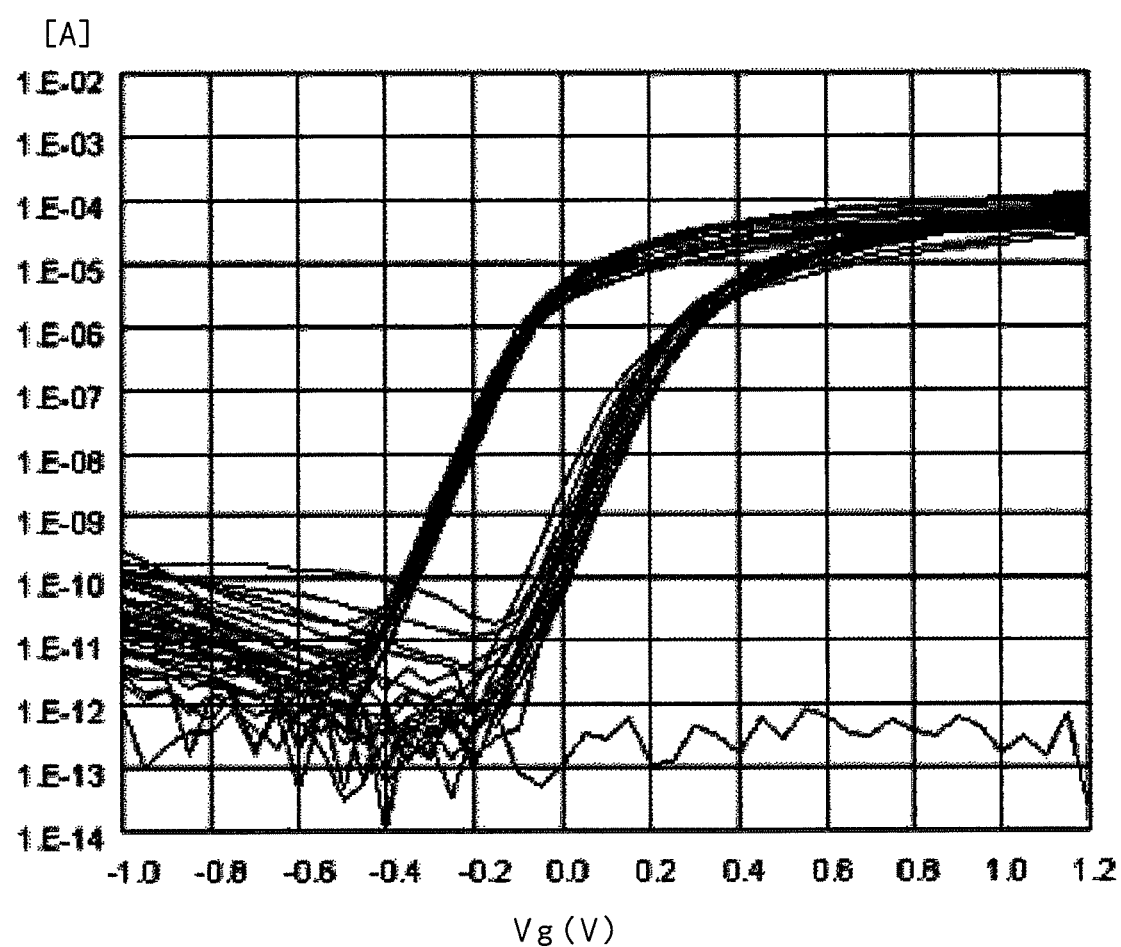

To address this problem, in the semiconductor device according to the embodiment, implantation conditions are adjusted (e.g., at implantation energy of 15 KeV) so that the range of impurity ions is the vicinity of the interface of the fin-shaped semiconductor portion 10 with the oxide film 18 shown in FIG. 13, thereby preventing the fin-shaped semiconductor portion 10 from being polycrystallized. Preventing the fin-shaped semiconductor portion 10 from being polycrystallized makes stable the on-current between the source and the drain with respect to the gate voltage (Vg) as shown in FIG. 24. Thus, transistor characteristics with less variations can be achieved. On the other hand, as shown in FIG. 25, if the fin-shaped semiconductor portion 10 is polycrystallized, the on-current between the source and the drain with respect to the gate voltage (Vg) has variations. Note that there are broadly two waveform groups in FIGS. 24 and 25, and the groups show the results of CD (Channel Doping) conditions that are different from each other.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
 a fin-shaped semiconductor portion having a source region formed on one side thereof and a drain region formed on other side thereof; and
 a gate electrode formed between said source region and said drain region to surround a top surface and side surface of said fin-shaped semiconductor portion with only a gate insulating film interposed therebetween,
 the semiconductor device further comprising:
 a first dummy pattern provided upon forming of said fin-shaped semiconductor portion; and a second dummy pattern provided upon forming of said gate electrode, wherein said first dummy pattern is positioned under said second dummy pattern, said first dummy pattern is separated from said fin-shaped semiconductor portion, said second dummy pattern is separated from said gate electrode, and said second dummy pattern does not overlap said first dummy pattern.

2. The semiconductor device according to claim 1, wherein said first dummy pattern does not overlap with a pattern of said fin-shaped semiconductor portion, and said second dummy pattern is not positioned under the pattern of said fin-shaped semiconductor portion.

3. The semiconductor device according to claim 2, wherein said first dummy pattern is square.

* * * * *